(12) United States Patent
Shiba

(10) Patent No.: US 7,994,012 B2
(45) Date of Patent: Aug. 9, 2011

(54) SEMICONDUCTOR DEVICE AND A METHOD OF MANUFACTURING THE SAME

(75) Inventor: Kazuyoshi Shiba, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 88 days.

(21) Appl. No.: 12/495,957

(22) Filed: Jul. 1, 2009

(65) Prior Publication Data

US 2010/0025754 A1 Feb. 4, 2010

(30) Foreign Application Priority Data

Aug. 1, 2008 (JP) ................................. 2008-199487

(51) Int. Cl.
*H01L 21/336* (2006.01)
(52) U.S. Cl. ........ 438/288; 438/197; 438/216; 438/217; 438/229; 438/230; 438/231; 438/232; 438/275; 438/276; 438/289
(58) Field of Classification Search .................. 438/197, 438/216, 217, 229–232, 275, 276, 288, 289
See application file for complete search history.

(56) References Cited

U.S. PATENT DOCUMENTS

| 6,191,463 | B1 * | 2/2001 | Mitani et al. ................... 257/411 |
| 6,261,889 | B1 * | 7/2001 | Ono ............................... 438/232 |
| 7,129,141 | B2 | 10/2006 | Oyu et al. |
| 2006/0138478 | A1 * | 6/2006 | Buh et al. ....................... 257/288 |
| 2007/0202645 | A1 * | 8/2007 | Luo et al. ....................... 438/255 |

FOREIGN PATENT DOCUMENTS

| JP | 2000-236074 A | 8/2000 |
| JP | 2005-197547 A | 7/2005 |
| JP | 2007-048882 A | 2/2007 |

* cited by examiner

*Primary Examiner* — Kevin M Picardat
*Assistant Examiner* — Bac H Au
(74) *Attorney, Agent, or Firm* — Miles & Stockbridge P.C.

(57) ABSTRACT

To improve characteristics of a semiconductor device having a nonvolatile memory. There is provided a semiconductor device having a nonvolatile memory cell that performs memory operations by transferring a charge to/from a charge storage film, wherein the nonvolatile memory cell includes a p well formed in a principal plane of a silicon substrate, and a memory gate electrode formed over the principal plane across the charge storage film, and wherein a memory channel region located beneath the charge storage film of the principal plane of the silicon substrate contains fluorine.

13 Claims, 25 Drawing Sheets

SEMICONDUCTOR DEVICE AND A METHOD OF MANUFACTURING THE SAME

CROSS-REFERENCE TO RELATED APPLICATION

The disclosure of Japanese Patent Application No. 2008-199487 filed on Aug. 1, 2008 including the specification, drawings and abstract is incorporated herein by reference in its entirety.

BACKGROUND OF THE INVENTION

The present invention relates to semiconductor device technology, and in particular relates to technology which is effective when applied to a semiconductor device having a nonvolatile memory.

As a nonvolatile semiconductor memory element (nonvolatile memory cell) capable of being electrically written and erased, an EEPROM (Electrically Erasable and Programmable Read Only Memory) is widely used. Such a nonvolatile memory cell has a structure (floating gate electrode structure) in which a conductive part in a floating state is provided beneath the gate electrode of an MIS (Metal Insulator Semiconductor) type field effect transistor (also called FET) (hereinafter, simply "MIS transistor"), or such a nonvolatile memory cell is constructed with an insulating film having a function to store a charge carrier (a carrier). The data write and data erase operations are achieved by storing an electric charge into the floating gate electrode or the charge storage film and controlling the injection or release of the electric charge to or from the charge storage region by means of the MIS structure.

As described above, when an electric charge is injected (or released) to (or from) the charge storage region, the threshold voltage of the MIS transistor will vary. In the MIS transistor, changes in the threshold voltage appear as differences in the drain current that flows in response to an applied gate voltage. With this amount of drain current of the MIS transistor, the charge storage state, i.e., the data retention state, can be read. The memory operation is achieved by the data write, erase, and read functions as described above.

As the insulating film having the charge storage function, a silicon nitride based insulating film (hereinafter, simply "silicon nitride film") is known. The silicon nitride film formed over a semiconductor substrate will be a film that contains a lot of defects therein depending on the forming conditions. Such defects in the film will function as a carrier trap level. A charge trapped by such a trap level of the silicon nitride film is unlikely to leak out. For this reason, the nonvolatile memory using the silicon nitride film as the charge storage film is excellent in long-term data retention.

Furthermore, in order for a carrier trapped by the silicon nitride film not to easily leak out to the upper electrode or the lower substrate, a structure wherein both sides of the silicon nitride film are sandwiched by other insulating film is useful. For example, the so-called ONO (oxide/Nitride/oxide) insulating film, wherein both sides of a silicon nitride film are sandwiched by a silicon oxide based insulating film (hereinafter, simply "silicon oxide film") or the like, is currently used. There is a nonvolatile memory cell that realizes the read operation by regarding this ONO insulating film as the gate insulating film of the MIS transistor. This cell employs gate electrode (Metal)/ONO insulating film/semiconductor substrate (Semiconductor) as the basic structure, and is referred to as the so-called MONOS type nonvolatile memory cell (hereinafter, simply "MONOS memory cell").

For example, Japanese patent laid-open No. 2007-48882 (Patent Document 1) discloses technology, wherein in the process of manufacturing a MOS (Metal Oxide Semiconductor) FET (Field Effect Transistor), fluorine is ion-implanted after forming the gate electrode, thereby causing the fluorine to be present in the semiconductor interface or in the semiconductor surface. This technology can achieve an improvement in the operation speed of the semiconductor device, an improvement in the noise characteristic, an improvement in the characteristic defect rate, and the like.

Moreover, for example, Japanese patent laid-open No. 2000-236074 (Patent Document 2) discloses technology, wherein in the step of forming MISFETs constituting a DRAM (Dynamic Random Access Memory), a fluorine ion is implanted after forming the gate insulating film or after forming the gate electrode, thereby introducing fluorine in the interface between the gate insulating film and the semiconductor substrate.

Moreover, for example, Japanese patent laid-open No. 2005-197547 (Patent Document 3) discloses technology, wherein in the step of forming MOS transistors constituting a DRAM or an SRAM (Static Random Access Memory), a halogen element is ion-implanted and diffused into the source/drain diffusion layer.

SUMMARY OF THE INVENTION

In the MONOS type memory cell, information is stored by transferring a charge to/from a charge storage film beneath the gate electrode. Hereinafter, as an example, the MONOS type memory cell will be described, wherein the gate insulating film of an n-channel type MIS transistor (hereinafter, simply "n-type MIS transistor") is the charge storage film of the ONO structure.

In the typical n-type MIS transistor, when a positive voltage is applied to the gate electrode, an n-type inversion layer is formed in a p-type semiconductor layer beneath the gate insulating film. The gate voltage value at this instance is called the threshold voltage. If the gate voltage value is equal to or higher than the threshold voltage, the carriers (electrons) will drift in the n-type inversion layer due to a bias between the source and the drain. In other words, if the gate voltage value is equal to or higher than the threshold voltage, a drift current can flow between the source and the drain with the n-type inversion layer as the channel. Then, if the bias between the source and the drain is constant, then the higher the gate voltage value, the further the carrier concentration of the n-type inversion layer will increase and the further the current between the source and the drain will increase.

In the n-type MIS transistor having such characteristics, the threshold voltage of the MONOS type memory cell having a charge storage film applied to the gate insulating film will vary depending on the charged conditions of the charge storage film. For example, if the charge storage film serving as the gate insulating film traps an electron of negative charge, then the field effect of the positive gate voltage onto the p-type semiconductor layer beneath the gate insulating film will be weakened. Accordingly, in order to form the n-type inversion layer in the relevant p-type semiconductor layer, a higher positive gate voltage needs to be applied. This implies that the threshold voltage has been increased.

On the other hand, if the charge storage film serving as the gate insulating film trapped a hole of positive charge, a positive field effect acts on the p-type semiconductor layer beneath the gate insulating film in advance. Accordingly, in the relevant p-type semiconductor layer, the n-type inversion layer can be formed with a lower positive gate voltage. This implies that the threshold voltage has been reduced.

As described above, in the MONOS type memory cell, the threshold voltage will vary depending on the charged conditions of the charge storage film. That is, if an electron is injected into the charge storage film, the threshold voltage will increase, while if a hole is injected, the threshold voltage will decrease. For example, a state where the threshold voltage is increased (a state where an electron is injected) is caused to correspond to the write state, and a state where the threshold voltage is reduced (the state where a hole is injected) is caused to correspond to the erase state. Then, such changes in the threshold voltage can be detected by the magnitude of the current between the source and the drain. In this manner, the MONOS type memory cell has a function to store one bit of information.

Here, the data retention characteristic in the nonvolatile memory cell is one of the important characteristic parameters indicating how long the relevant nonvolatile memory cell can hold its memory state. In the MONOS type memory cell, since the charged conditions of the charge storage film are caused to correspond to the memory states, the more firmly the charge storage film can trap a charge, the more excellent the retention characteristic becomes.

However, further study on the technology of improving the retention characteristic of the MONOS type memory cell conducted by the present inventor has revealed the following problems.

Of the ONO film constituting the charge storage film, the film that traps a charge is the nitride film (N film). Then, in order for the charge trapped by the nitride film to be unlikely to leak out to the upper electrode or the lower substrate, the nitride film is sandwiched by an oxide film (O film). Accordingly, by thickening this oxide film, the charge is more unlikely to leak out and the retention characteristic will be improved. However, if the oxide film is thickened, then in order to inject a charge into the nitride film, a higher voltage needs to be applied. This becomes a cause of preventing improvement in characteristics of the nonvolatile memory, e.g., causing a decrease in the breakdown voltage of an element, an increase in scale of the peripheral circuit, or a decrease in the operation speed.

On the other hand, if the oxide film is thin, a charge trapped by the nitride film is likely to leak out. In particular, in the surface of the lower silicon substrate, dangling bonds, other crystal defects, and the like are present, via which the charge is more likely to leak out. As described above, the use of a structure, in which a charge trapped by the nitride film is likely to leak out, will be a cause to degrade the retention characteristic of the nonvolatile memory.

As can be seen, in the semiconductor device with the MONOS type memory cell studied by the present inventor, further improvement in the retention characteristic is difficult.

It is thus an object of the present invention to provide technology for improving the characteristics of the semiconductor device having the nonvolatile memory.

The above and other objects and novel features of the present invention will be apparent from the description and accompanying drawings of the present specification.

Although a plurality of inventions will be disclosed in the present application, a summary of one embodiment among the disclosed inventions is described briefly as follows.

There is provided a semiconductor device including a nonvolatile memory cell formed in a semiconductor substrate, wherein the nonvolatile memory cell comprises: a first semiconductor region of a first conductivity type formed in a principal plane of the semiconductor substrate; and a memory gate electrode disposed across a charge storage film at a position included in the first semiconductor region in a planar view, over the principal plane of the semiconductor substrate, and wherein the nonvolatile memory cell performs a memory operation by transferring a charge to/from the charge storage film. Furthermore, this nonvolatile memory cell contains fluorine in a channel region located beneath the charge storage film, of the principal plane of the semiconductor substrate.

The advantage obtained by the above-described embodiment among the inventions disclosed in the present application is described briefly as follows.

That is, the characteristics of a semiconductor device having a nonvolatile memory can be improved.

DETAILED DESCRIPTION OF THE PREFERRED EMBODIMENTS

The following embodiments will be described, divided into plural sections or embodiments, if necessary for convenience. Except for the case where it shows clearly in particular, they are not mutually unrelated and one has relationships such as a modification, details, and supplementary explanation of some or entire of another. In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiments, it is needless to say that an element (including an element step etc.) is not necessarily indispensable, except for the case where it is clearly specified in particular and where it is considered to be clearly indispensable from a theoretical point of view, etc. Similarly, in the following embodiments, when shape, position relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above. Moreover, in all the accompanying drawings for describing the embodiments of the present invention, the same numeral will be given to the element having the same function to avoid the redundant description as much as possible. Hereinafter, the embodiments of the present invention will be described in detail in accordance with the accompanying drawings.

Embodiment 1

Figure 1:
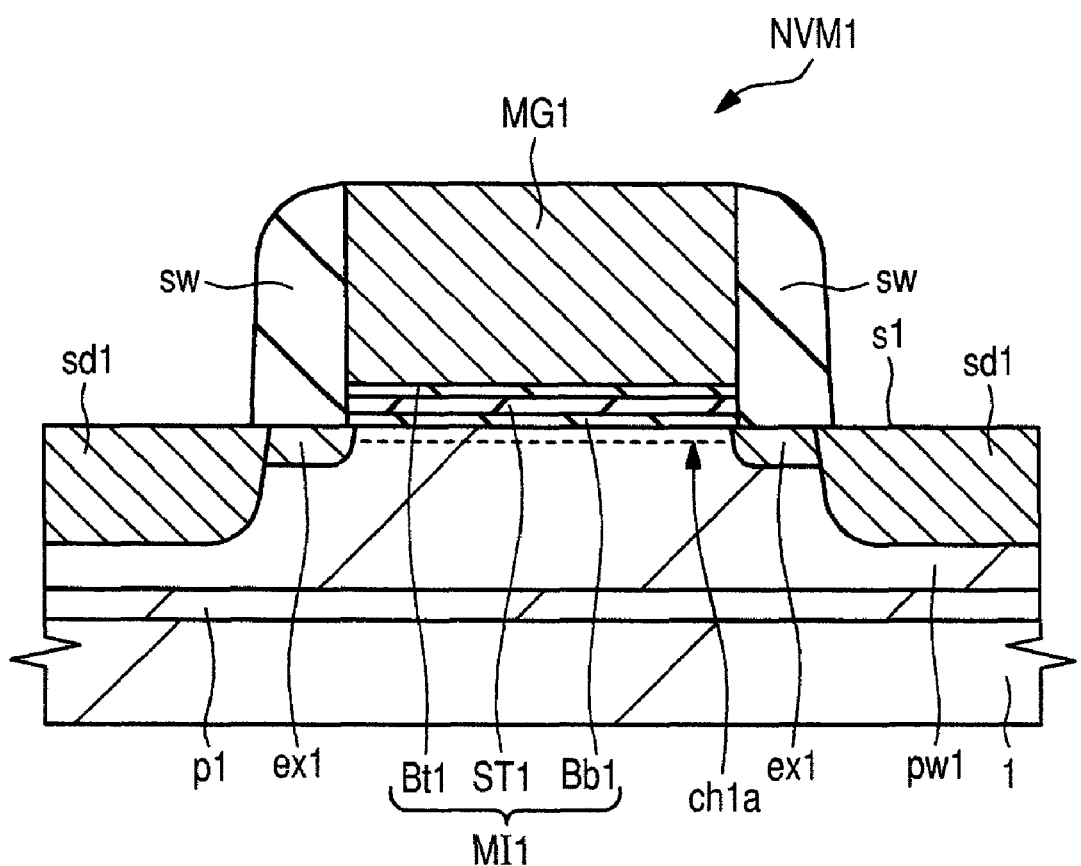
FIG. 1 is a cross sectional view of a principal part of a semiconductor device of Embodiment 1 according to the present invention.

The structure of a nonvolatile memory cell of a semiconductor device of Embodiment 1 is described in detail using FIG. 1. FIG. 1 is a cross sectional view of a principal part of a nonvolatile memory cell NVM1 of Embodiment 1. The semiconductor device of Embodiment 1 includes a plurality of nonvolatile memory cells NVM1 formed in a silicon substrate (a semiconductor substrate) 1.

The silicon substrate 1 may be a laminated semiconductor material of p-type conductivity or n-type conductivity comprising single crystal silicon (Si). In this Embodiment 1, the conductivity type of the silicon substrate 1 is p-type. In the silicon substrate 1 or in various kinds of semiconductor regions described below, p-type conductivity refers to the conductivity type of such a semiconductor material that contains more acceptor impurities than donor impurities wherein the majority carrier is a hole. On the other hand, n-type conductivity refers to the conductivity type of such a semiconductor material that contains more donor impurities than acceptor impurities wherein the majority carrier is an electron. As described above, p-type conductivity and n-type conductivity have mutually opposite polarities (mutually opposite conductivity types). Hereinafter, the p-type conductivity is referred to as a first conductivity type, while the n-type conductivity opposite to the p-type conductivity is referred to as a second conductivity type. However, in the following description, these relationships may be reversed.

The nonvolatile memory cell NVM1 of Embodiment 1 includes constituent elements described in detail below. A p-type semiconductor region p1 is formed in a principal plane s1 of the silicon substrate 1. Furthermore, a p well (first semiconductor region) pw1 is formed shallower than the semiconductor region p1 in the principal plane s1 of the silicon substrate 1. The p well pw1 is a p-type semiconductor region and is an element formation region for forming the nonvolatile memory cell NVM1.

Moreover, a memory gate electrode MG1 is formed across a charge storage film MI1 over the principal plane s1 of the silicon substrate 1. The charge storage film MI1 and the memory gate electrode MG1 are disposed at a position included in the p well pw1 in a planar view, over the principal plane s1 of silicon substrate 1.

The charge storage film MI1 is a film having a function to store charges, such as an electron and a hole. For example, the charge storage film MI1 may be a conductive film (conductive film in a floating state) surrounded by an insulating film, or may be an insulating film of the ONO structure. However, in the nonvolatile memory NVM1 of Embodiment 1, the charge storage film MI1 is more preferably an insulating film of the ONO structure, because the gate voltage for transferring charges to/from the insulating film of the ONO structure can be set lower than the gate voltage for transferring charges to/from the conductive film in a floating state. This leads to effects, such as a reduction of the area of the memory and an improvement in the reliability. Hereinafter, the structure of the charge storage film MI1 in the nonvolatile memory NVM1 of Embodiment 1 will be described in more detail.

The charge storage film MI1 includes a lower barrier film (first insulating film) Bb1, a charge storage film (second insulating film) ST1, and an upper barrier film (third insulating film) Bt1 that are disposed in the order nearer to the silicon substrate 1. That is, the charge storage film MI1 has the structure sandwiching the upper and lower sides of the charge storage film (second insulating film) ST1 with the both barrier films Bb1, Bt1.

The charge storage film ST1 is an insulating film having a function to trap charges. As such an insulating film, an insulating film having a large number of charge trapping centers (also simply referred to as traps) therein is suitable. The examples of this include insulating films mainly composed of silicon nitride (SiN), hafnium silicate (HfSiO), hafnium aluminate (HfAlO), hafnium oxide ($HfO_2$), aluminum oxide ($Al_2O_3$), and the like. Among them, as the charge storage film ST1 of Embodiment 1, an insulating film mainly composed of silicon nitride (hereinafter, simply "silicon nitride film") is applied.

Moreover, the upper and lower barrier films Bb1, Bt1 sandwiching the charge storage film ST1 are insulating films having a function to prevent a charge trapped by the charge storage film ST1 from leaking to the outside. As such an insulating film, an insulating film, which has a sufficiently high energy barrier when viewed from a charge trapped by the traps in the charge storage film ST1, is suitable. In other words, an insulating film having a wider band gap than the silicon nitride film and having a sufficiently high band offset with respect to both the conduction band side and the valence band side between this insulating film and the silicon nitride films is suitable. As such an insulating film, a silicon oxide ($SiO_2$) based insulating film (hereinafter, simply "silicon oxide film") is applied to the upper and lower barrier films Bb1, Bt1 of Embodiment 1.

As described above, the charge storage film MI1 of Embodiment 1 has the ONO structure, wherein a silicon nitride film having the charge trapping property is sandwiched by a silicon oxide film having the barrier property.

The memory gate electrode MG1 comprises a polycrystalline silicon (also referred to as polysilicon) based conductive film.

Thus, the nonvolatile memory cell NVM1 of Embodiment 1 has the MONOS structure comprising the memory gate electrode MG1 serving as the conductor region, the charge storage film MI1 serving as the insulator region of the ONO structure, and the p well pw1 serving as the semiconductor region. In other words, the nonvolatile memory cell NVM1 has the MIS structure if the ONO structure is regarded as one insulator region. Furthermore, the nonvolatile memory cell NVM1 of Embodiment 1 has a charge supply mechanism as described below.

The nonvolatile memory cell NVM1 of Embodiment 1 has the charge supply mechanism comprising a memory extension region (second semiconductor region) ex1 and a memory source/drain region (third semiconductor region) sd1 in the principal plane s1 of the silicon substrate 1 in the lateral lower part of the memory gate electrode MG1. The memory extension region ex1 and the memory source/drain region sd1 are formed in the principal plane s1 of the silicon substrate 1 in the p well pw1. In particular, the memory extension region ex1 is disposed in the lateral lower part of the memory gate electrode MG1, and the memory source/drain region sd1 is disposed in the outer side of the memory extension region ex1 in a planar view. The memory extension region ex1 and the memory source/drain region sd1 are of the same conductivity type and electrically coupled to each other.

The memory extension region ex1 is an n-type semiconductor region for supplying a charge to the above-described MONOS structure. Accordingly, for the memory extension region ex1, the structural parameters, such as the impurity concentration and the depth, are determined by the property (current during the memory operation) as the MIS transistor of the nonvolatile memory cell NVM1.

Moreover, the memory source/drain region sd1 is an n-type semiconductor region for smoothly transferring charges from/to the outside to/from the memory extension region ex1. Accordingly, the memory source/drain region sd1 of a lower resistivity is more preferable. From this reason, the impurity concentration of the memory source/drain region sd1 is higher than that of the memory extension region ex1, and the depth thereof is deeper than that of the memory extension region ex1.

The nonvolatile memory cell NVM1 of Embodiment 1 supplies charges to the p well pw1 and the like by having the charge supply mechanism comprising the memory extension region ex1 and the memory source/drain region sd1.

Moreover, a side wall spacer sw comprising a silicon oxide film is formed so as to cover the side wall of the memory gate electrode MG1. This is a constituent element for isolating the memory gate electrode from other conductive parts, for example, such as a contact plug (not illustrated). The side wall spacer sw is formed so as to cover from the side wall of the memory gate electrode MG1 throughout at least the surface of the memory extension region ex1 of the principal plane s1 of the silicon substrate 1 in the lateral lower part of the side wall of the memory gate electrode MG1.

Here, there is technology for improving the characteristics as the MIS transistor by applying a stress to the substrate (in particular, the channel region and the like). For the purpose of this, the side wall spacer sw may be formed using a material that has a large operating stress on the silicon substrate 1. In this case, for example, a three-layer structure comprising a silicon oxide film, a silicon nitride film, and a silicon oxide film in the order nearer to the silicon substrate 1 is effectively applied as the side wall spacer sw. Hereinafter, the description will be given assuming that the side wall spacer sw comprises only a silicon oxide film.

The aforementioned is the basic structure of the nonvolatile memory cell NVM1 of Embodiment 1. The nonvolatile memory cell NVM1 of Embodiment 1 has the following configuration other than the above-described configuration. That is, the nonvolatile memory cell NVM1 of Embodiment 1 contains fluorine (F) in a memory channel region ch1*a* of the principal plane s1 of the silicon substrate 1.

Usually, in the MIS transistor, the channel region is a region located beneath the gate insulating film of the surface of a semiconductor region, and is a region where the inversion layer is formed by the field effect from the gate electrode. Likewise, also in the nonvolatile memory cell NVM1 of Embodiment 1, the memory channel region ch1*a* is a region located beneath the charge storage film MI1, which corresponds to the gate insulating film of the surface of the p well pw when the MONOS structure is regarded as the MIS structure.

The nonvolatile memory cell NVM1 of Embodiment 1 has the following effects by containing fluorine in the memory channel region ch1a as described above.

Usually, the memory channel region ch1a that is a part of the p well pw1 of p-type silicon contains a large number of dangling bonds and other defects. Such dangling bonds and defects are likely to trap a charge, which is one cause of assisting a charge trapped by the charge storage film to leak out to the silicon substrate in the ordinary nonvolatile memory cell. In contrast, in the memory channel region ch1a of Embodiment 1, these dangling bonds and other defects can be deactivated by introducing fluorine. From this viewpoint, by introducing fluorine of a halogen element into the memory channel region ch1a of Embodiment 1, the dangling bonds and defects can be deactivated, thereby causing a charge trapped by the charge storage film MI1 to be unlikely to leak out. Thus, according to the nonvolatile memory cell NVM1 of Embodiment 1, the retention characteristic can be improved. As a result, the characteristics of the semiconductor device having the nonvolatile memory can be improved.

In order to describe this effect in more detail, hereinafter, the method of operation of the nonvolatile memory cell NVM1 of Embodiment 1 will be described.

Figure 2:
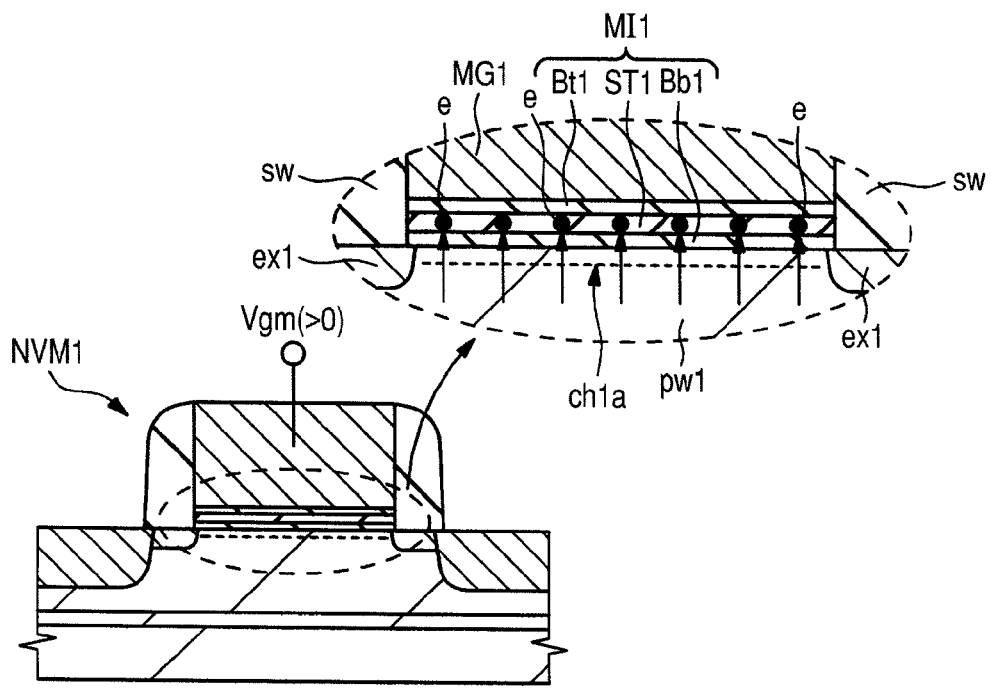
FIG. 2 is a cross sectional view of a principal part for illustrating a write operation of the semiconductor device of Embodiment 1 according to the present invention, and a partially enlarged view thereof.

FIG. 2 shows cross sections of a principal part for illustrating the write operation of the nonvolatile memory cell NVM1 of Embodiment 1. In the write operation, a positive voltage is applied as a memory gate voltage Vgm applied to the memory gate electrode MG1. As the positive memory gate voltage Vgm is increased, an inversion layer is formed in the memory channel region ch1a and an electron e is generated. As the positive memory gate voltage Vgm is further increased, the electron e in the inversion layer of the memory channel region ch1a or the electron e as the minority carrier in the p well pw is pulled to the positive memory gate voltage Vgm, and is injected into the charge storage film ST1 through the lower barrier film Bb1. As described above, the electron e is injected into the charge storage film MI1 by the so-called FN (Fowler-Nordheim) tunnel effect.

By injecting the electron e into the charge storage film MI1, the threshold voltage of the MONOS type nonvolatile memory cell NVM1 as the MIS transistor will rise. In this manner, the nonvolatile memory cell NVM1 of Embodiment 1 can be brought into a write state.

Figure 3:
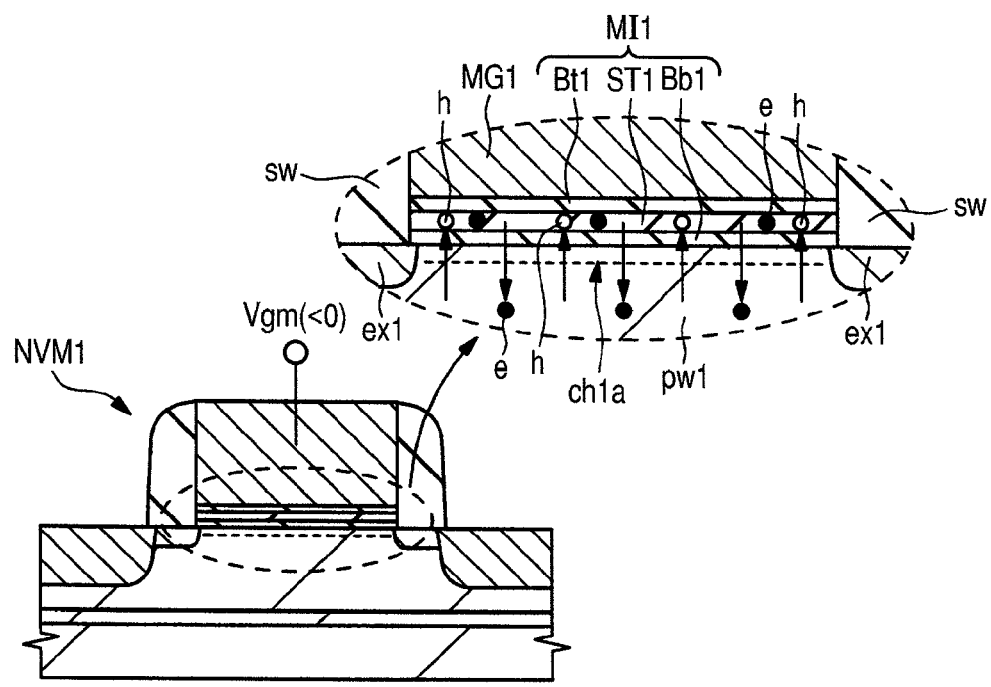
FIG. 3 is a cross sectional view of a principal part for illustrating an erase operation of the semiconductor device of Embodiment 1 according to the present invention, and a partially enlarged view thereof.

FIG. 3 shows cross sections of the principal part for illustrating the erase operation of the nonvolatile memory cell NVM1 of Embodiment 1. In the erase operation, a negative voltage is applied as the memory gate voltage Vgm. As the negative memory gate voltage Vgm is increased, the electron e injected into the charge storage film MI1 by the write operation is released to the p well pw1 through the lower barrier film Bb1 by the FN tunnel effect. Moreover, in this situation, a hole h that is the majority carrier in the p well pw1 is injected into the charge storage film pw1 through the lower barrier film Bb1 by the FN tunnel effect.

Although the respective behaviors of these electron e and hole h are different, the polarity to which the charge storage film MI1 is charged is the same. That is, by transferring the charges to/from the charge storage film MI1 as described above, the electron e is released or the hole h is injected, and the charge storage film MI1 is positively charged. The threshold voltage of the MONOS type nonvolatile memory cell NVM1 as the MIS transistor will decrease by the charge storage film MI1 being positively charged. In this manner, the nonvolatile memory cell NVM1 of Embodiment 1 can be brought into an erase state.

The write state and the erase state that are set in the nonvolatile memory cell NVM1 as described above are read as follows.

Figure 4:
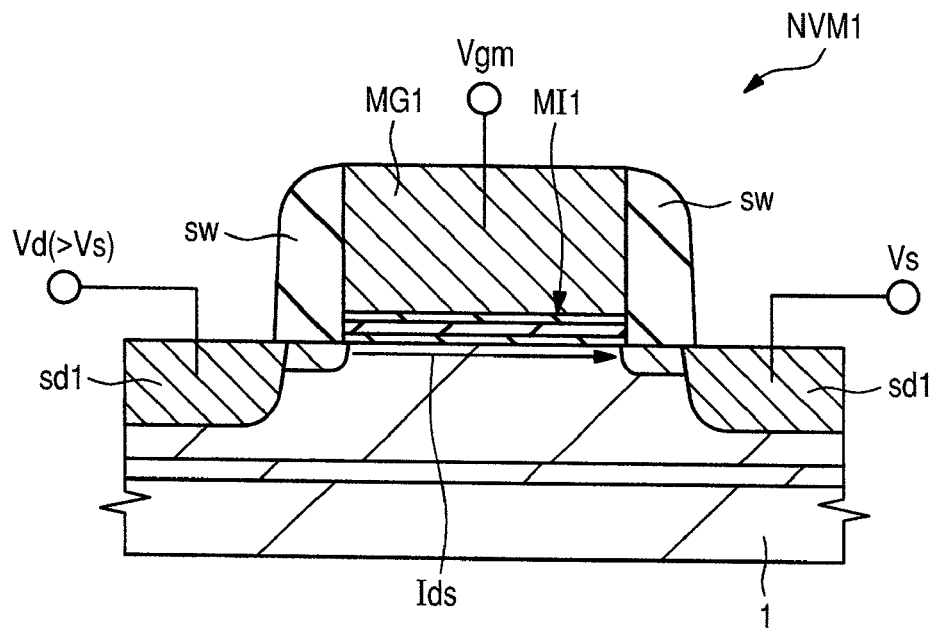
FIG. 4 is a cross sectional view of a principal part for illustrating a read operation of the semiconductor device of Embodiment 1 according to the present invention.

FIG. 4 is a cross sectional view of the principal part for illustrating the read operation of the nonvolatile memory cell NVM1 of Embodiment 1. In the read operation, different voltages are applied to the two memory source/drain regions sd1. For example, the low voltage side is a source voltage Vs and the high voltage side is a drain voltage Vd. In this case, if this is an ordinary MIS transistor, a source/drain current Ids in response to the gate voltage will flow. In particular, by applying a gate voltage equal to or higher than the threshold voltage, the transistor is turned on and a sufficient source/drain current Ids will flow.

Here, in the nonvolatile memory cell NVM1 of Embodiment 1, the threshold voltage will vary depending on the charged conditions of the charge storage film MI1. Accordingly, even if a predetermined memory gate voltage Vgm is applied, the magnitude of the source/drain current Ids will differ depending on whether the memory cell is in the write state or the erase state. For example, since the threshold voltage in the erase state is low as compared with that in the write state, a higher source/drain current Ids will flow even if the same memory gate voltage Vgm is applied. By detecting such a magnitude of the source/drain current Ids, the memory state of the nonvolatile memory cell NVM1 can be read.

As described above, the nonvolatile memory cell NVM1 of Embodiment 1 realizes the memory operations such as the write operation, the erase operation, and the read operation by transferring charges to/from the charge storage film MI1.

Figure 5:
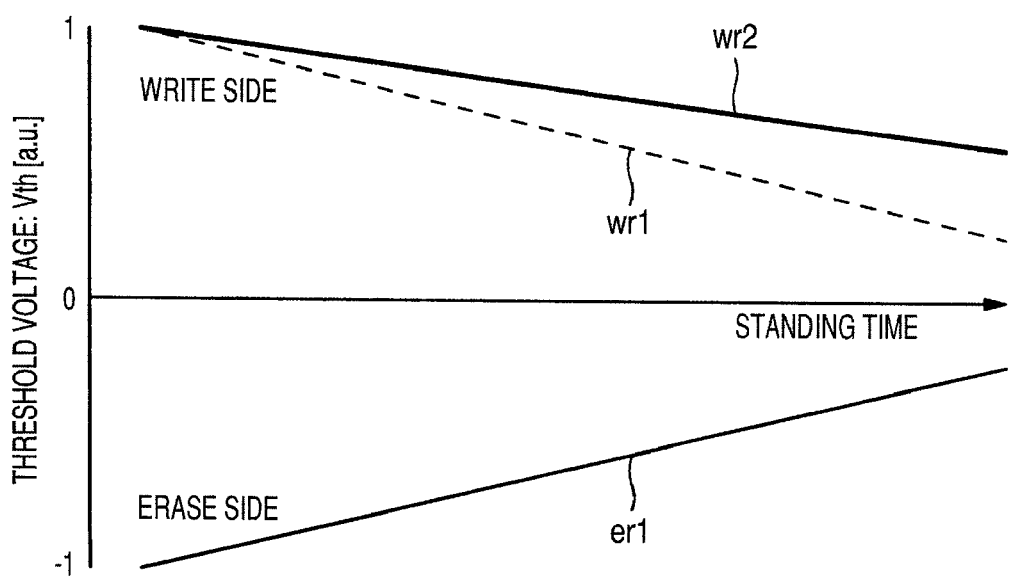
FIG. 5 is a graph chart showing characteristics of the semiconductor device of Embodiment 1 according to the present invention.

Here, FIG. 5 is a graph chart showing time variations of the threshold voltage in the write state or the erase state. Namely, this is a graph showing the time variations of the threshold voltage when the threshold voltage was varied by the write operation or the erase operation and then the memory cell was left in this state, in the memory cell studied by the present inventor. In the view, the variation of the threshold voltage in the write state is represented by a write characteristic wr1, and the variation of the threshold voltage in the erase state is represented by an erase characteristics er1. Note that these characteristics illustrate the characteristics of an ordinary nonvolatile memory cell for ease of description and are not the characteristics of the nonvolatile memory cell NVM1 of Embodiment 1.

As described above, the threshold voltage of the memory cell subjected to the write operation will rise to a positive value. This is because the electron e of negative charge was injected into the charge storage film MI1 (see FIG. 2). Moreover, the threshold voltage of the memory cell subjected to the erase operation will fall to a negative value. This is because the hole h of positive charge was injected into the charge storage film MI1 (or the electron e of negative charge is released from the charge storage film MI1) (see FIG. 3).

Then, the threshold voltage in such write or erase state attempts to return to the original value with time. This is because the charges in the charge storage film MI1, the charges causing the threshold voltage to vary as described above, are escaping to the memory gate electrode MG1 or the p well pw1 with time.

Here, as described above, in the read operation of the nonvolatile memory cell NVM1 of Embodiment 1, the memory state is determined by the magnitude of the source/drain current Ids when the predetermined memory gate voltage Vgm is applied (see FIG. 4). In this case, the memory gate voltage Vgm is set to a voltage value between the erase characteristic er1 and the write characteristic wr1 in FIG. 5. Accordingly, in the memory cell in the erase state, the value of the threshold voltage is the value of the erase characteristic er1, so if the memory gate voltage Vgm higher than this value is applied in the read operation, an on-current is detected as the source/drain current Ids. On the other hand, in the memory cell in the write state, the value of the threshold voltage is the value of the write characteristic wr1, so if the memory gate voltage Vgm lower than this value is applied in the read operation, an off-current will be detected as the source/drain current Ids By setting to such conditions for applying the memory gate voltage Vgm, the memory state can be read by the on/off current of the nonvolatile memory cell NVM1. Usually, the difference between the on-current and the off-current of a MIS transistor is large, which is preferable for determining the memory state.

From the above-described viewpoint, in order to successfully read the memory state of the nonvolatile memory cell NVM1, a larger difference (window) in the threshold voltages between the write state and the erase state is more preferable. That is, in FIG. 5, a wider distance between the write characteristic wr1 and the erase characteristic er1 is preferable (the window is wide). Because the fact that the difference in the threshold voltages between the write state and the erase state is small (the window is narrow) is synonymous with a small tolerance for successfully reading the memory state against the fluctuations or variations of the memory gate voltage Vgm and this fact will be one factor in causing a malfunction. Such a problem becomes prominent in particular as time goes after the write or erase operation. Accordingly, in order to successfully read the memory state of the nonvolatile memory cell NVM1 even after the passage of time, the write and read characteristics wr1, er1 with smaller gradients are more preferable characteristics.

The nonvolatile memory cell NVM1 of Embodiment 1 contains fluorine in the memory channel region ch1*a* as described using FIG. 1. Thereby, the dangling bonds and defects of the p well pw1 are deactivated by the fluorine, and the charges (electron e and hole h) of the charge storage film MI1 are unlikely to leak out, as described above. When the present inventor verified this effect, a write characteristic wr2 of FIG. 5 was obtained. That is, when the time variation of the threshold voltage in the write state of the nonvolatile memory cell NVM1 of Embodiment 1 was measured, the write characteristic wr2 was obtained.

As compared with the write characteristic wr1 of the ordinary nonvolatile memory cell, the write characteristic wr2 of the nonvolatile memory cell NVM1 of Embodiment 11 has a smaller gradient, and the decreasing rate of the threshold voltage against the passage of time is smaller. This means that a wider window can be taken in the time variation of the threshold voltage of the nonvolatile memory cell NVM1. That is, the effect that "the charge in the charge storage film MI1 becomes unlikely to leak out due to containment of fluorine in the memory channel region ch1*a*" has been verified. Thus, according to the nonvolatile memory cell NVM1 of Embodiment 1, the retention characteristic can be improved. As a result, the characteristics of the semiconductor device having the nonvolatile memory can be improved.

Hereinafter, a method of manufacturing a semiconductor device having the nonvolatile memory cell NVM1 of Embodiment 1 will be described in detail. In particular, the steps of forming, over the silicon substrate 1, the nonvolatile memory cell NVM1 of Embodiment 1 and both n and p-type MIS transistors constituting a peripheral circuit are described using FIG. 6 to FIG. 19. Each of the views shows a cross section of a principal part during the manufacturing process of a semiconductor device having the nonvolatile memory cell NVM1 of Embodiment 1. The nonvolatile memory NVM1 is formed in a memory region Rm of the silicon substrate 1, and the MIS transistors are formed in a peripheral region Rp. Note that, in the constituent element formed in each step described hereinafter, with regard to the structures, usages, and functions described above, the duplicate description will be omitted.

Figure 6:
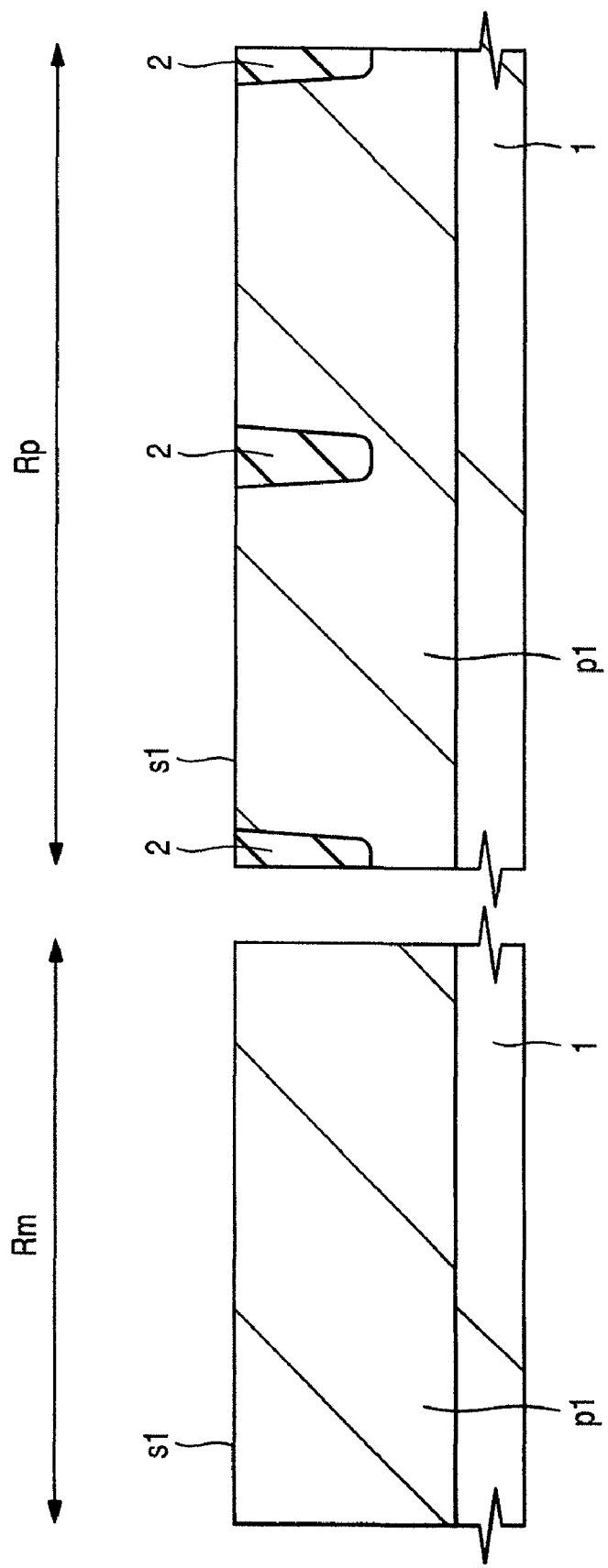
FIG. 6 is a cross sectional view of a principal part during the manufacturing process of the semiconductor device of Embodiment 1 according to the present invention.

As shown in FIG. 6, the p-type semiconductor region p1 is formed on the principal plane s1 side of the silicon substrate 1. The semiconductor region p1 is formed by being grown as a single crystal over the silicon substrate 1, for example, by epitaxial growth or the like. Usually, the silicon substrate 1 including the semiconductor region p1 over the silicon substrate 1 is treated as the silicon substrate 1. Accordingly, hereinafter, the surface of the p-type semiconductor region p1 is described as the principal plane s1 of the silicon substrate 1.

Subsequently, in order to define a region where the elements are formed over the principal plane s1 of the silicon substrate 1, an isolation 2 is formed. As the isolation 2, the isolation 2 of the so-called STI (Shallow Trench Isolation) structure that is a shallow groove type insulating film is applied. In order to do this, a shallow groove is formed by a series of photolithography and anisotropic etching, and then the isolation 2 of the STI structure is formed by embedding a silicon oxide based insulating film into this groove, for example. Note that the isolation 2 may be formed by LOCOS (Local Oxidation of Silicon).

Figure 7:
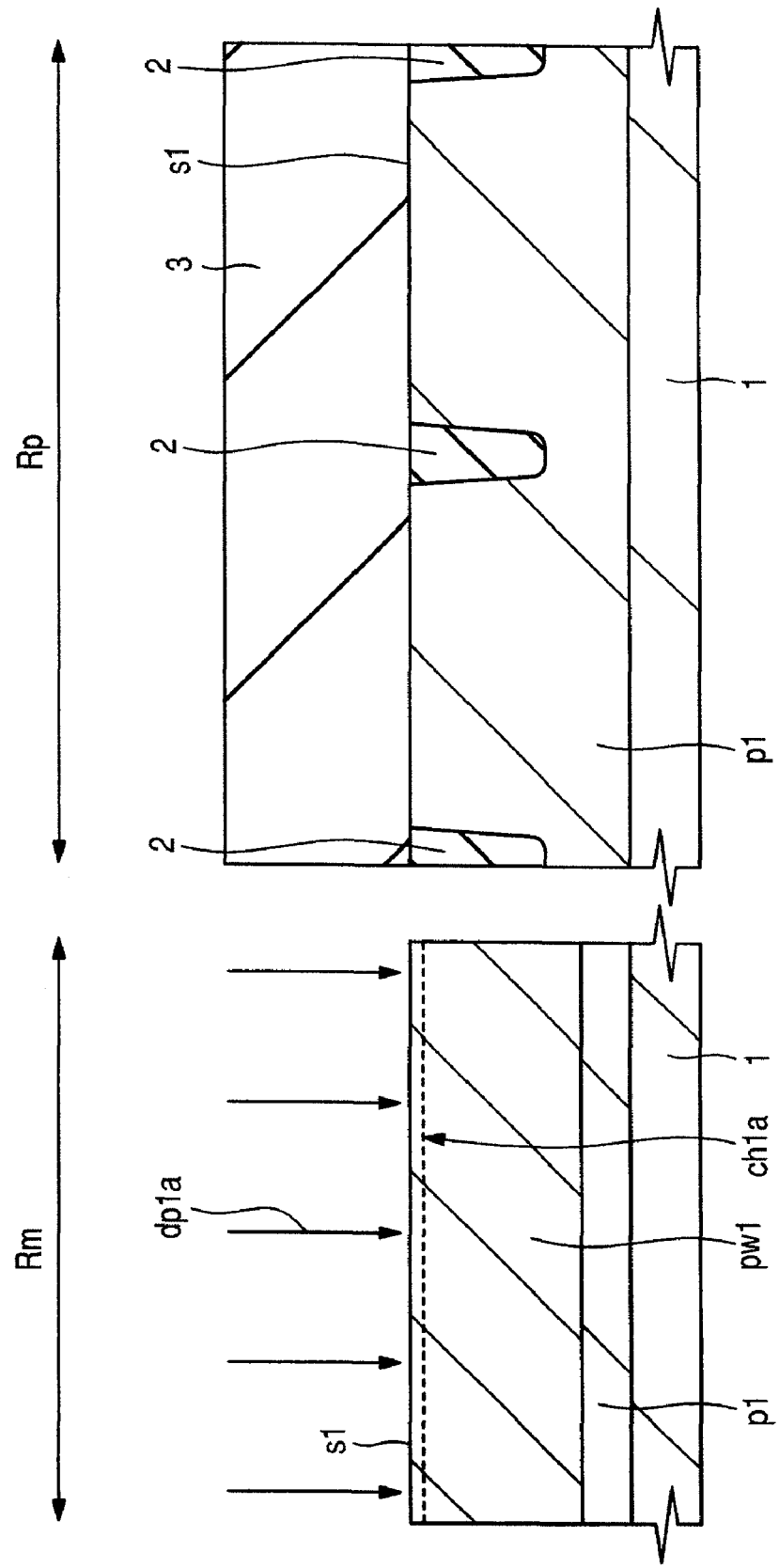
FIG. 7 is a cross sectional view of the principal part during the manufacturing process of the semiconductor device following the step of FIG. 6.

Next, as shown in FIG. 7, the p well pw1 is formed in the principal plane s1 of the memory region Rm of the silicon substrates 1. Here, first, a p-type impurity is implanted into the principal plane s1 of the memory region Rm of the silicon substrate 1 by ion implantation or the like. Subsequently, by performing a heat treatment (annealing), the implanted impurity is diffused to a desired depth and at the same time is activated, and thereby the p well pw1 is formed.

Here, the p well pw1 is a semiconductor region for forming the element, and the conductivity type of the impurity and the impurity concentration differ depending on the characteristics of the element. Accordingly, in performing ion implantation for forming the p well pw1, the peripheral region Rp is covered in advance with a photoresist film 3 patterned by photolithography. Then, the above-described ion implantation is performed with the photoresist film 3 as an ion implantation mask. Thereby, the ion implantation for forming the p well pw1 of the memory region Rm can be performed without affecting the peripheral region Rp.

Subsequently, ion implantation is performed to obtain the memory channel region ch1*a* having a desired impurity concentration. As described in FIG. 1, the memory channel region ch1*a* is the region located beneath the charge storage film MI1 to be formed later and where the inversion layer is formed, of the principal plane s1 of the silicon substrate 1. At the stage of this step, the charge storage film MI1 has not been formed yet, so the memory channel region ch1*a* cannot be distinguished from other regions in the vicinity of the principal plane s1 of the silicon substrate 1. That is, in this step, the ion implantation for adjusting the channel concentration is performed also to the region other than the portion to serve later as the memory channel region ch1*a*. In the view, the region in the vicinity of the principal plane s1 of the silicon substrate 1 of the memory region Rm is denoted as the memory channel region ch1*a*.

The impurity concentration of the memory channel region ch1*a* is one factor for determining the threshold voltage of the MIS type element, and the concentration is set in accordance with the required characteristic of the element. Moreover, the impurity seed implanted to adjust the impurity concentration of the memory channel region ch1a and the concentration vary depending on the impurity concentration of the target p well pw1. For example, boron (B), phosphorus (P), arsenic (As), or the like is ion implanted. In this case, if the photoresist film 3 used in forming the p well pw1 is used similarly, the number of steps can be reduced.

Here, the manufacturing method of Embodiment 1 has a step of introducing fluorine into the memory channel region ch1a, as the next step. Fluorine is implanted into the memory channel region ch1a of the principal plane s1 of the silicon substrate 1 of the memory region Rm by first ion implantation dp1a. Subsequently, the fluorine implanted into the channel region is activated by performing a heat treatment (a first heat treatment) at about 800 to 1100° C. Thereby, the dangling bonds, other defects, and the like that are contained in the memory channel region ch1a and serve as a charge trap can be deactivated by the fluorine. In this manner, the configuration of the nonvolatile memory cell NVM1 exhibiting the effect as described using FIG. 1 to FIG. 5 can be formed.

According to the verification of the present inventor, in this step, it is more effective to introduce fluorine with a dosage of about $1 \times 10^{13}$ to $1 \times 10^{15}$ cm$^{-2}$ as the first ion implantation dp1a. Moreover, it is more effective to perform the first ion implantation dp1a with such an acceleration energy that the peak of the concentration distribution of the implanted fluorine comes to a position within 50 nm depth from the principal plane s1 of the silicon substrate 1.

Figure 8:
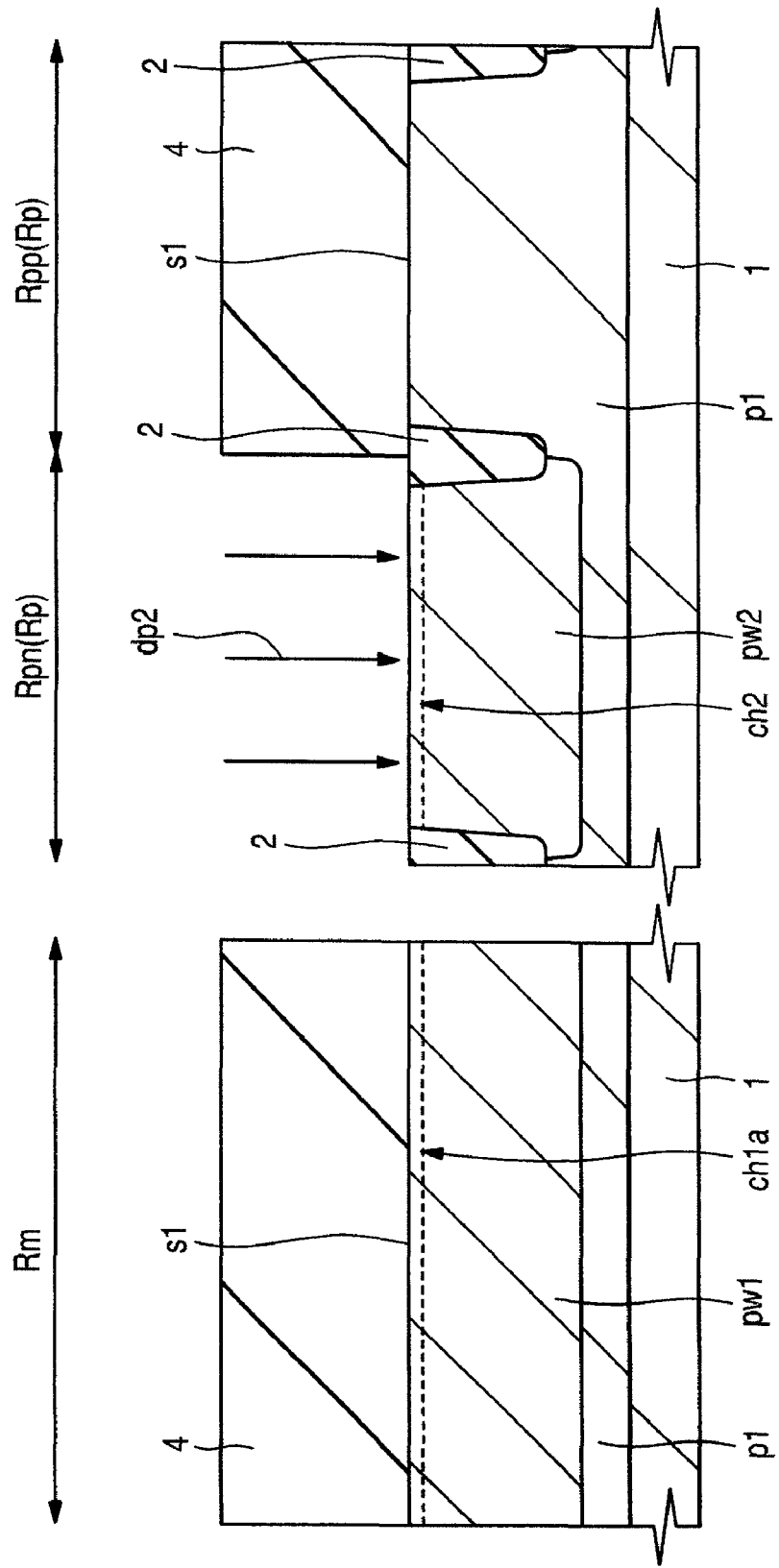
FIG. 8 is a cross sectional view of the principal part during the manufacturing process of the semiconductor device following the step of FIG. 7.

Next, as shown in FIG. 8, a peripheral p well pw2 is formed in the principal plane s1 of the silicon substrate 1 of an n-type peripheral region Rpn, where an n-type MIS transistor is formed later, of the peripheral region Rp. The peripheral p well pw2 is a p-type semiconductor region and has a higher impurity concentration than that of the semiconductor region p1. In order to do this, for example, the peripheral p well pw2 is formed by introducing a p-type impurity into the n-type peripheral region Rpn by ion implantation dp2, followed by performing a heat treatment.

Note that, the ion implantation dp2 will not be performed to the memory region Rm, and the p-type peripheral region Rpp where a p-type MIS transistor is formed later and a region where a MIS transistor having different characteristics is formed, of the peripheral region Rp. For this reason, in performing the ion implantation dp2, the principal plane s1 of the silicon substrate 1 corresponding to the memory region Rm, the p-type peripheral region Rpp, and the like is covered by a photoresist film 4 patterned by photolithography, and then the ion implantation dp2 is performed with the photoresist film 4 as an ion implantation mask.

Moreover, by this step, ion implantation for adjusting the channel concentration may be performed to a peripheral channel region ch2 in the n-type peripheral region Rpn. In this case, as with the ion implantation dp2, the use of the photoresist film 4 as the ion implantation mask eliminates the need to form a new ion implantation mask and can reduce the number of steps.

Figure 9:
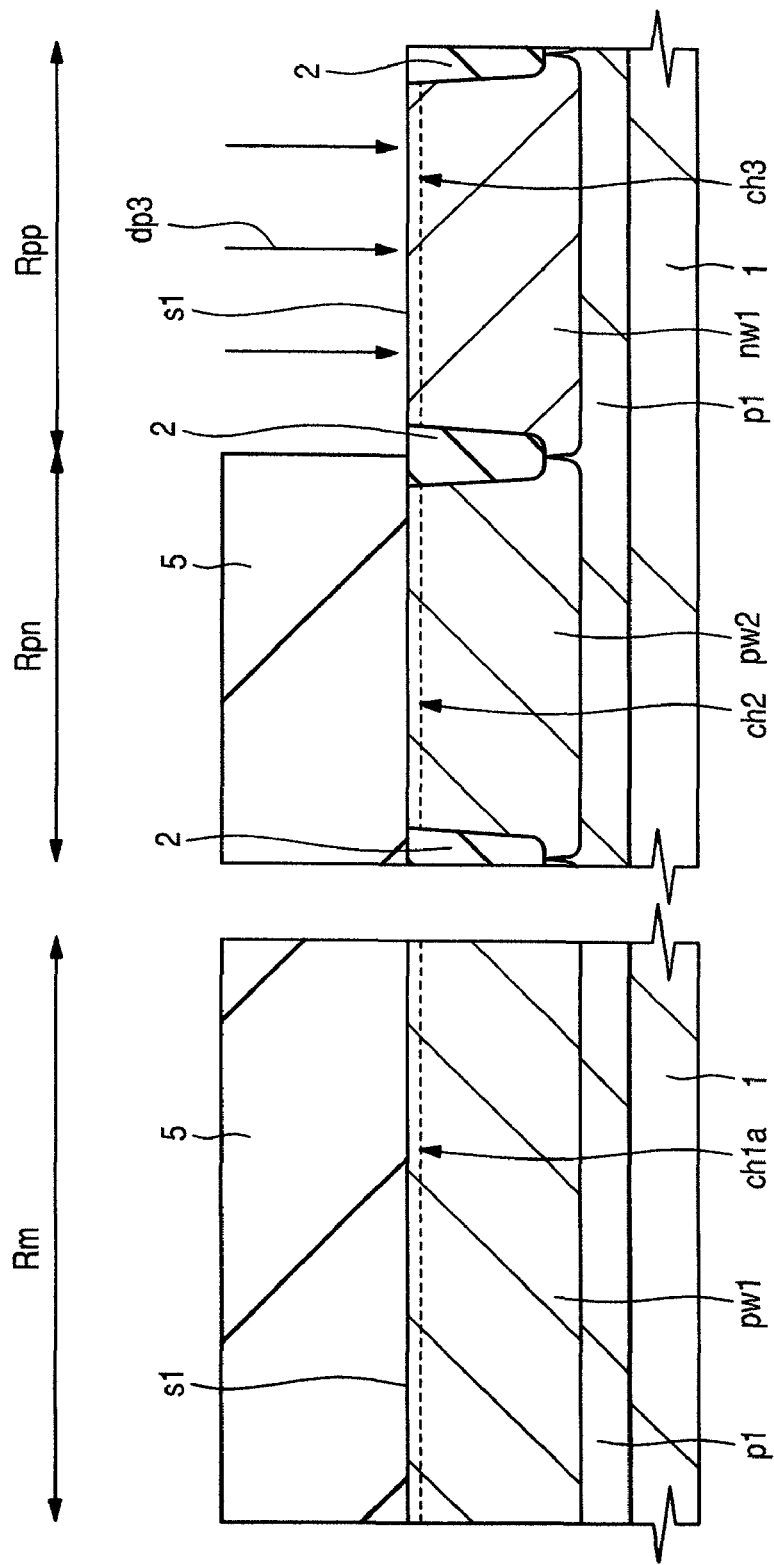
FIG. 9 is a cross sectional view of the principal part during the manufacturing process of the semiconductor device following the step of FIG. 8.

Next, as shown in FIG. 9, a peripheral n well nw1 is formed in the principal plane s1 of the silicon substrate 1 in the p-type peripheral region Rpp. The peripheral n well nw1 is an n-type semiconductor region. In order to do this, for example, the peripheral n well nw1 is formed by introducing an impurity serving as an n-type dopant to the p-type peripheral region Rpp by ion implantation dp3, followed by performing a heat treatment.

Note that the ion implantation dp3 will not be performed to the peripheral n-type region Rpn of the peripheral region Rp and the memory region Rm. For this reason, in performing the ion implantation dp3, the principal plane s1 of the silicon substrate 1 corresponding to the memory region Rm, the n-type peripheral region Rpn, and the like is covered by a photoresist film 5 patterned by photolithography, and the ion implantation dp3 is performed with the photoresist film 5 as an ion implantation mask.

Moreover, by this step, ion implantation for adjusting the channel concentration may be performed to a peripheral channel region ch3 in the p-type peripheral region Rpp. In this case, as with the ion implantation dp3, the use of the photoresist film 5 as the ion implantation mask eliminates the need to form a new ion implantation mask and can reduce the number of steps.

Figure 10:
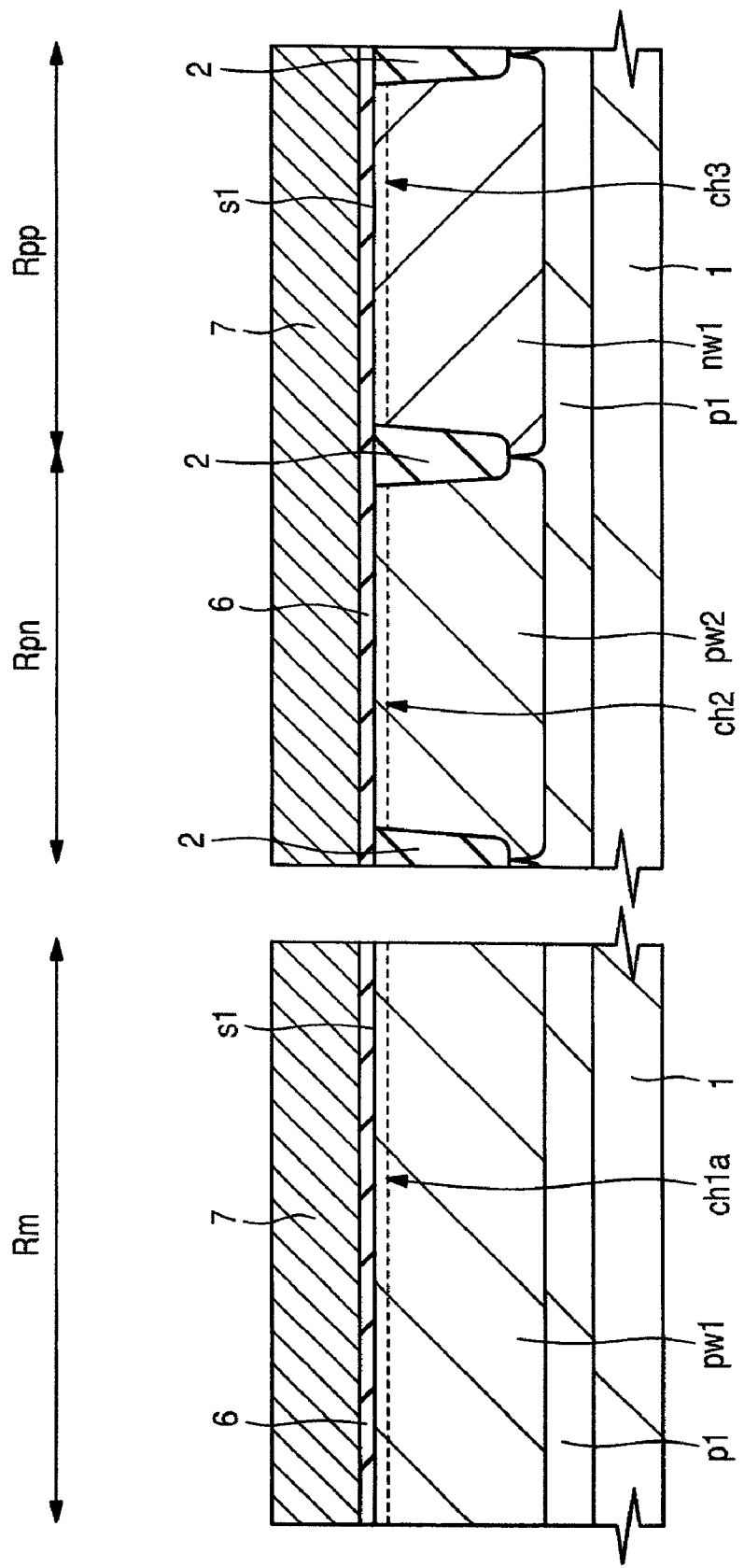
FIG. 10 is a cross sectional view of the principal part during the manufacturing process of the semiconductor device following the step of FIG. 9.

Next, as shown in FIG. 10, a silicon oxide film 6 and a polysilicon film 7 are sequentially formed so as to cover the principal plane s1 of the silicon substrate 1. The silicon oxide film 6 is a silicon oxide based insulating film and formed by thermal oxidation, for example. Moreover, the polysilicon film 7 is a polysilicon based conductive film and formed by chemical vapor deposition (CVD), for example. These silicon oxide film 6 and polysilicon film 7 are processed in the subsequent steps and serve as the gate insulating film and the gate electrode of the MIS transistor as the peripheral circuit (to be described later in detail). Therefore, in the next step, the silicon oxide film 6 and the polysilicon film 7 in the memory region Rm are removed.

Figure 11:
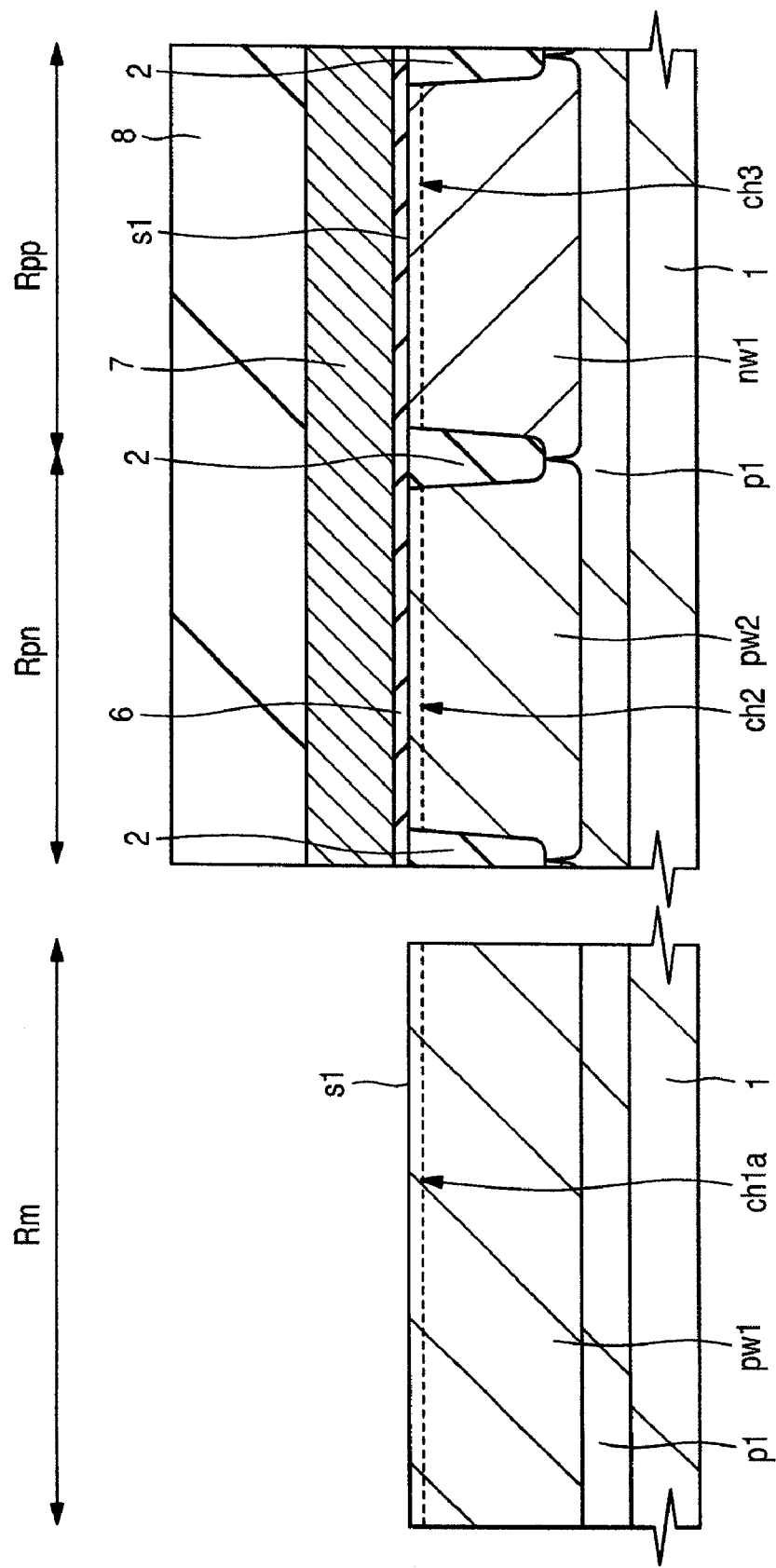
FIG. 11 is a cross sectional view of the principal part during the manufacturing process of the semiconductor device following the step of FIG. 10.

As shown in FIG. 11, a photoresist film 8 is formed so as to cover the polysilicon film 7 in the peripheral regions Rpn, Rpp. The photoresist film 8 is patterned by photolithography or the like as described above. Then, anisotropic etching is performed sequentially over the polysilicon film 7 and the silicon oxide film 6 with the photoresist film 8 as an etching mask. In this manner, the polysilicon film 7 and the silicon oxide film 6 of the memory region Rm are removed. Subsequently, the photoresist film 8 is removed.

Figure 12:
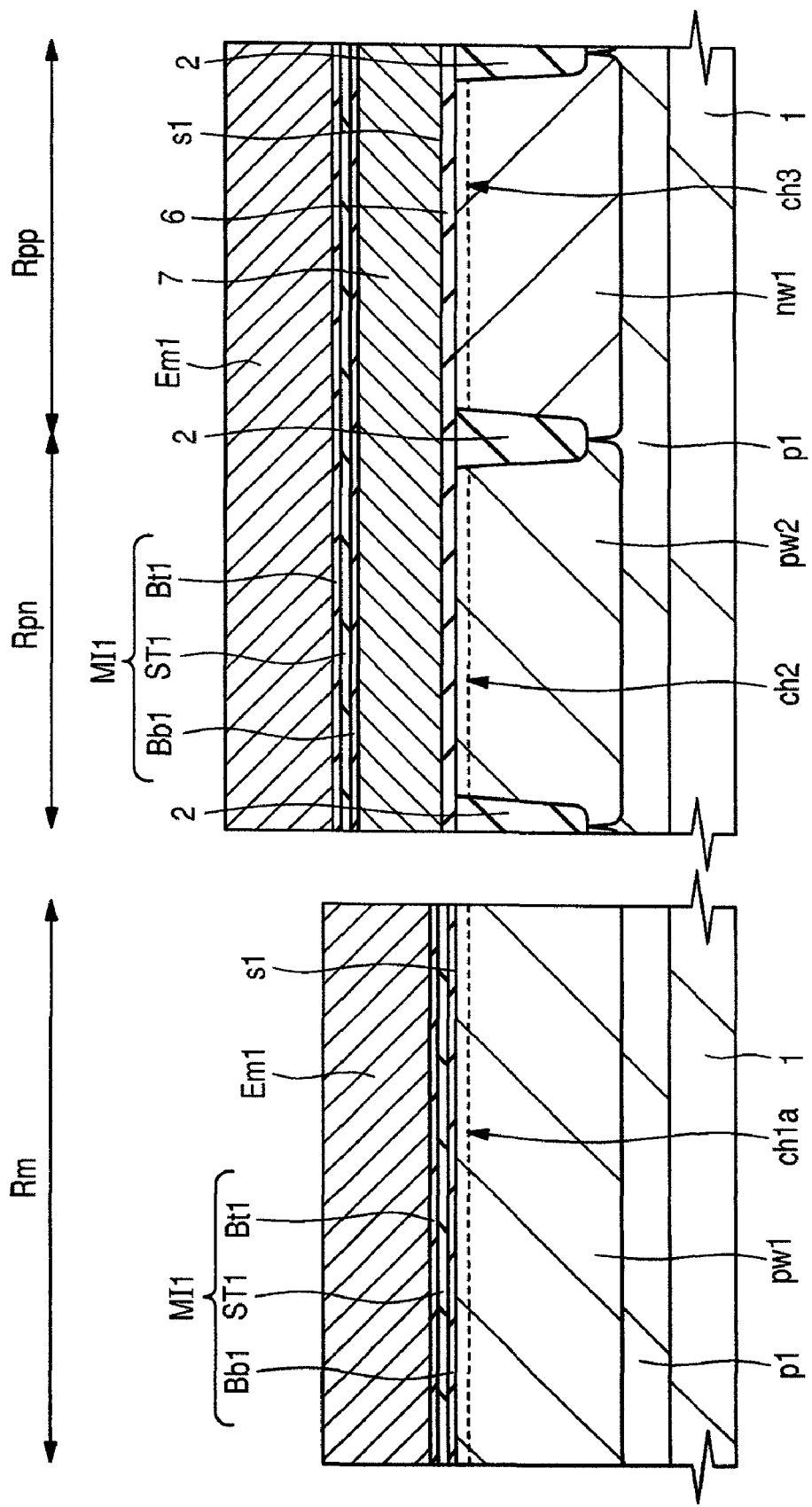
FIG. 12 is a cross sectional view of the principal part during the manufacturing process of the semiconductor device following the step of FIG. 11.

Next, as shown in FIG. 12, in the principal plane s1 of the silicon substrate 1 in the memory region Rm, the lower barrier film Bb1, the charge storage film ST1, and the upper barrier film Bt1 are formed as the charge storage film MI1, and then on top of these films, a memory gate conductive film Em1 is formed. That is, the memory gate conductive film Em1 is formed across the charge storage film MI1 over the principal plane s1.

The lower barrier film Bb1 and the upper barrier film Bt1 are insulating films having a function to prevent charge leakage, and for example, as described above, a silicon oxide based insulating film is formed. These films are formed by thermal oxidation. The charge storage film ST1 is an insulating film having a function to trap a charge, and for example, as described above, an insulating film or the like mainly composed of silicon nitride, hafnium silicate, hafnium aluminate, hafnium oxide, aluminum oxide, or the like is formed. Here, as the charge storage film ST1, the silicon nitride based insulating film is formed by CVD.

Moreover, as the memory gate conductive film Em1, a conductive film comprising polysilicon is formed by CVD. The memory gate conductive film Em1 is a conductive film that will serve as the memory gate electrode MG1 in a subsequent step. The memory gate electrode MG1 contains the impurity of a predetermined impurity concentration so as to have a desired electrical characteristic. Then, in this step, a polysilicon film containing the relevant impurity in advance may be deposited as the memory gate conductive film Em1, or a predetermined impurity may be introduced by ion implanting after deposition of the polysilicon film.

This step forms the charge storage film MI1 and the memory gate conductive film Em1 without forming a mask or the like in the peripheral circuit regions Rpn, Rpp. Accordingly, the same film is formed also over the polysilicon film 7 in the peripheral regions Rpn, Rpp, however, this film causes no inconvenience because it will be removed in a subsequent step.

Figure 13:
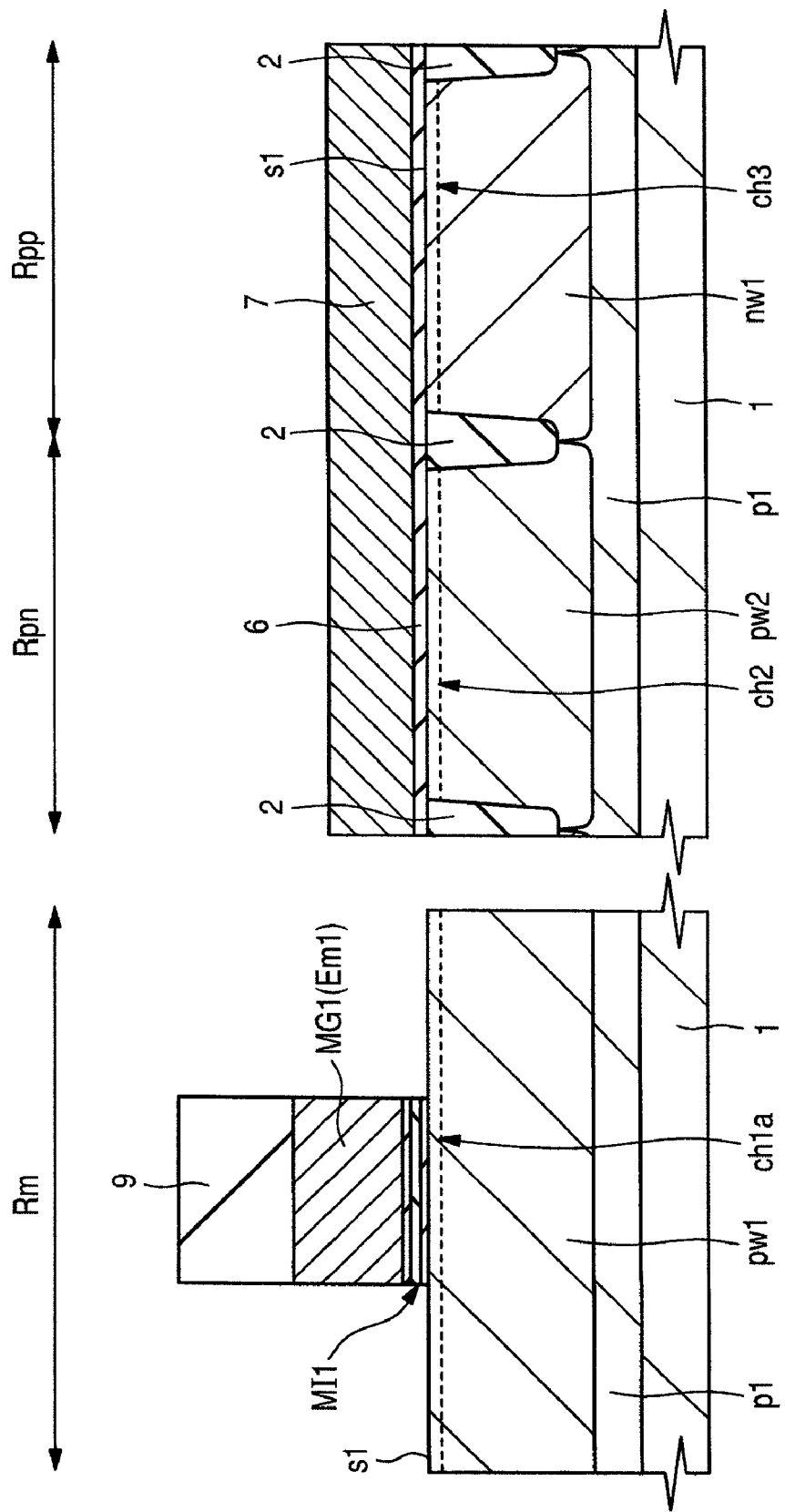
FIG. 13 is a cross sectional view of the principal part during the manufacturing process of the semiconductor device following the step of FIG. 12.

The subsequent step forms the memory gate electrode by processing the memory gate conductive film Em1. As shown in FIG. 13, a photoresist film 9 is formed so as to cover a portion that will remain as the memory gate electrode MG1, of the memory gate conductive film Em1 in the memory region Rm. Then, anisotropic etching is performed on the memory gate conductive film Em1 with the photoresist film 9 as an etching mask. Thus, the memory gate electrode MG1 comprising the memory gate conductive film Em1 is formed. Continuously, anisotropic etching is performed also on the charge storage film MI1. Thereby, the charge storage film MI1 is processed so as to be disposed between the memory gate electrode MG1 and the silicon substrate 1. In this step, the memory gate electrode MG1 is formed across the charge storage film MI1 at a position included in the p well pw1 in a planar view, of the principal plane s1 of the silicon substrate 1.

Note that, in this step, since the photoresist film 9 is not formed in the peripheral regions Rpn, Rpp, the memory gate conductive film Em1 in the peripheral regions Rpn, Rpp and the charge storage film MI1 are completely removed.

Moreover, in the manufacturing method of Embodiment 1, the insulating film of the ONO structure has been formed as the charge storage film MI1. Other than this, a conductive film floated by being sandwiched by insulating films may also have a function to trap a charge and this conductive film may be formed as the charge storage film MI1. However, in the manufacturing method of Embodiment 1, the charge storage film MI1 of the ONO structure as described above is more preferable. The reason is as described above using FIG. 1. As a result, the characteristics of the semiconductor device having the nonvolatile memory can be improved further.

Figure 14:
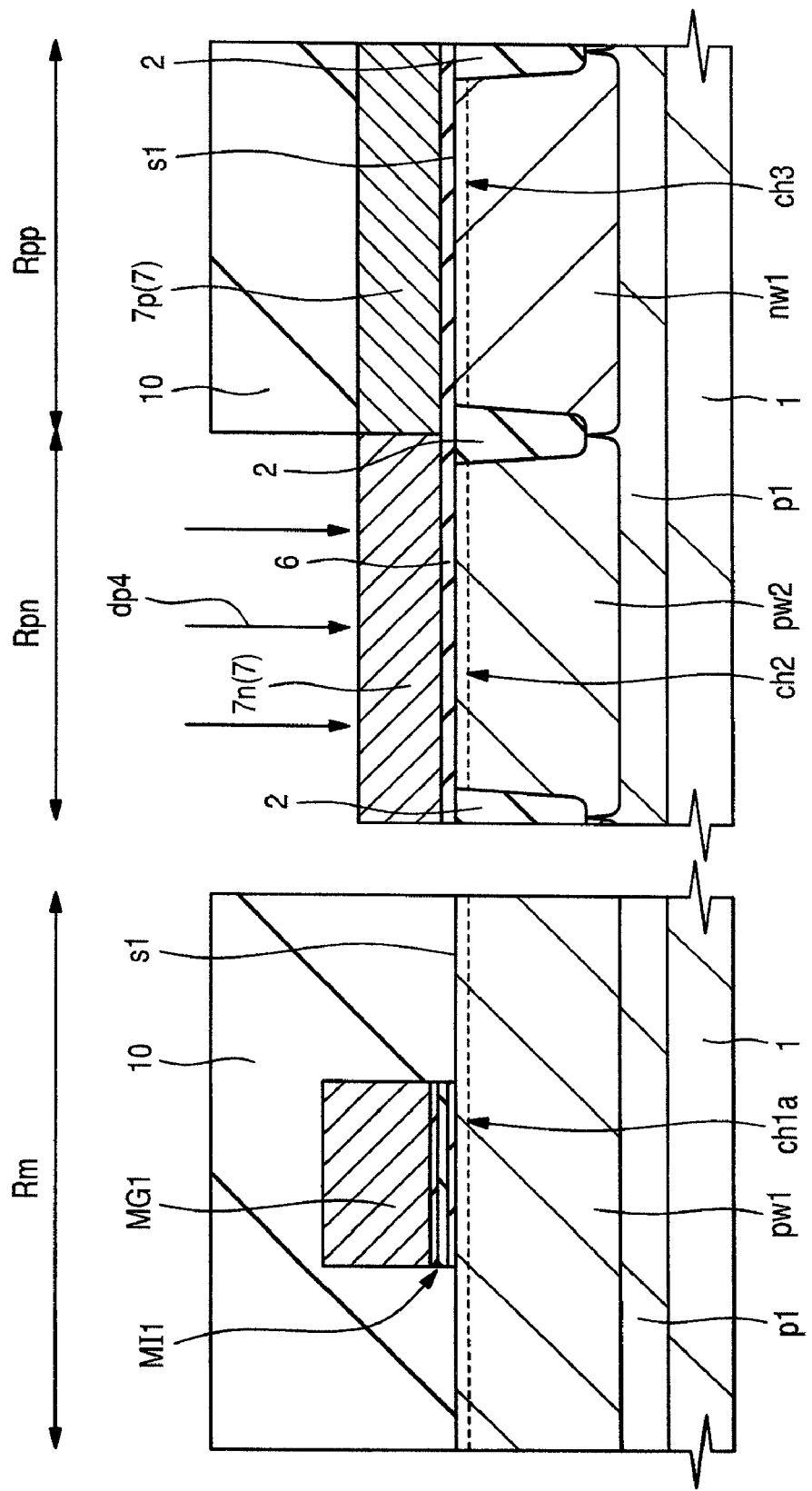
FIG. 14 is a cross sectional view of the principal part during the manufacturing process of the semiconductor device following the step of FIG. 13.

Next, as shown in FIG. 14, an impurity is implanted into the polysilicon film 7 in the peripheral regions Rpn, Rpp by ion implantation dp4 so that the polysilicon film 7 may obtain a desired electrical characteristic. For example, an n-type impurity is implanted into the polysilicon film 7 in the n-type peripheral region Rpn, and a p-type impurity is implanted into the polysilicon film 7 in the p-type peripheral region Rpp.

In order to do this, first, the memory region Rm and the p-type peripheral region Rpp are covered by a photoresist film 10, and the ion implantation dp4 is performed with this film as an ion implantation mask. Thus, an n-type polysilicon film 7n is formed by introducing the n-type impurity into the polysilicon film 7 in the n-type peripheral region Rpn. Similarly, a photoresist film is formed in the memory region Rm and the n-type peripheral region Rpn, and ion implantation is performed with this film as an ion implantation mask (not illustrated). Thus, a p-type polysilicon film 7p is formed by introducing a p-type impurity into the polysilicon film 7 in the p-type peripheral region Rpp. Subsequently, by performing a heat treatment, the introduced each impurity is diffused and activated. Note that whichever of the n-type polysilicon film 7n and the p-type silicon film 7p may be formed first.

Figure 15:
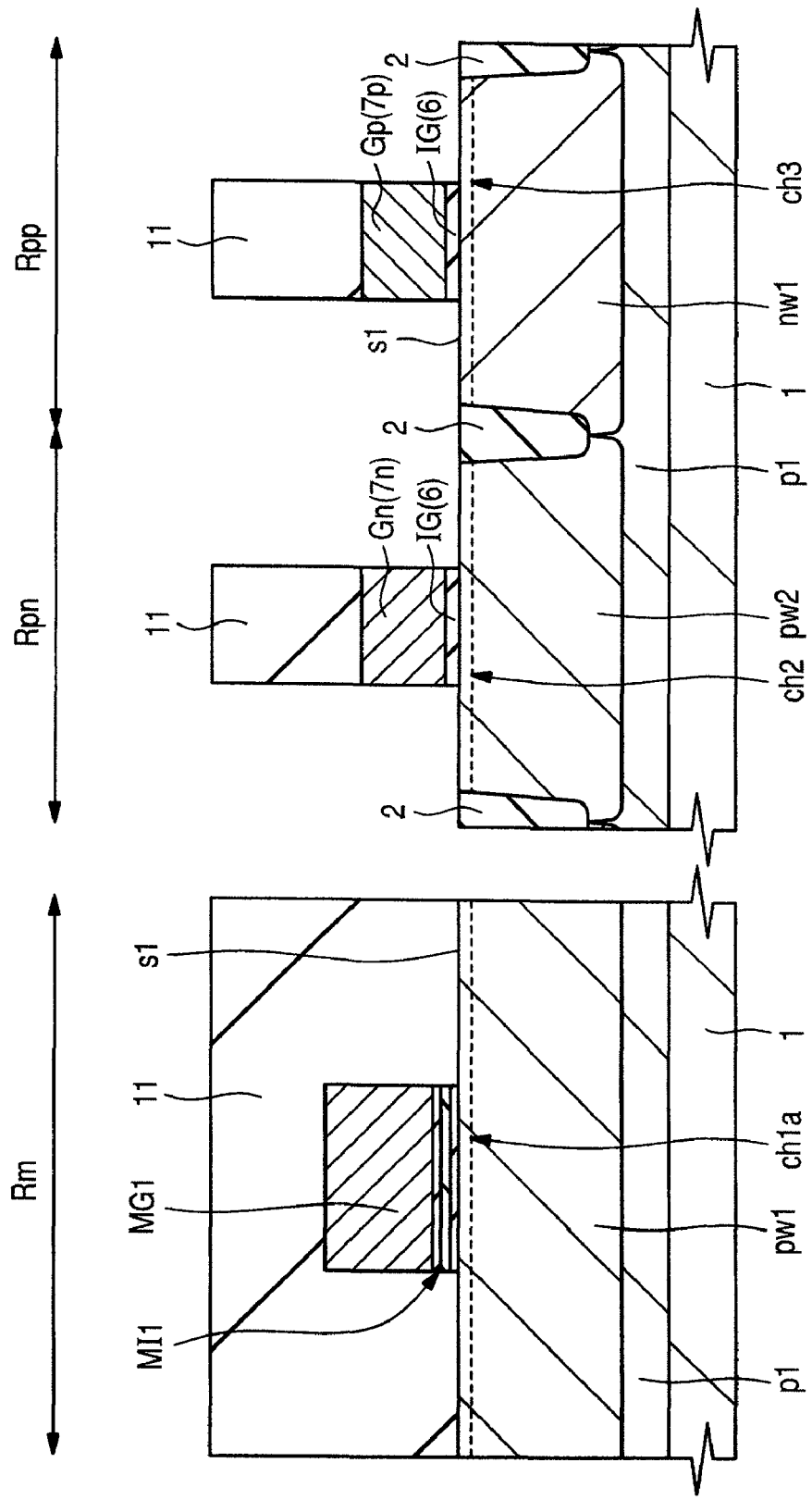
FIG. 15 is a cross sectional view of the principal part during the manufacturing process of the semiconductor device following the step of FIG. 14.

Next, as shown in FIG. 15, a photoresist film 11 is formed so as to cover the entire memory region Rm and the polysilicon films 7n, 7p of a portion desired to be remained as the gate electrode of the peripheral regions Rpn, Rpp. In order to do this, the photoresist film 11 having a shape as described above is formed by patterning the photoresist film 11 by photolithography.

Subsequently, anisotropic etching is performed on the polysilicon films 7n, 7p with the photoresist film 11 as an etching mask. Thus, by removing the exposed portions of polysilicon films 7n, 7p, an n-type peripheral gate electrode Gn comprising the n-type polysilicon film 7n is formed in the n-type peripheral region Rn. Moreover, in the p-type peripheral region Rp, a p-type peripheral gate electrode Gp comprising the p-type polysilicon film 7p is formed. The n-type and p-type peripheral gate electrodes Gn, Gp are formed so as to be disposed across the silicon oxide film 6 over the principal plane s1 of the silicon substrate 1.

Subsequently, the exposed portion of silicon oxide film 6 is removed by performing anisotropic etching on the silicon oxide film 6 with the same photoresist film 11 as an etching mask. In this manner, such a peripheral gate insulating film IG comprising the silicon oxide film 6 that is disposed between the n-type and p-type peripheral gate electrodes Gn, Gp and the silicon substrate 1 is formed.

Figure 16:
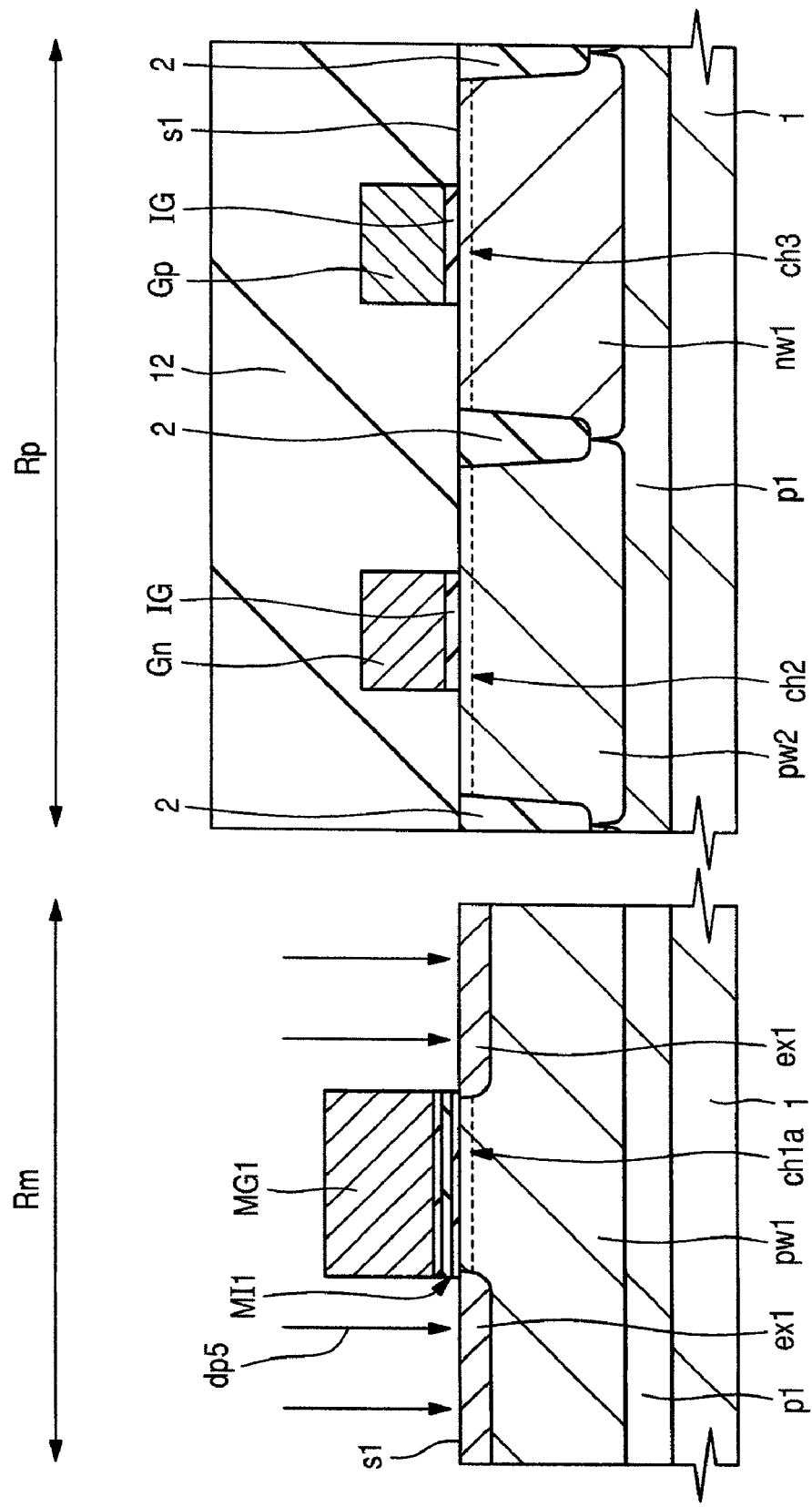
FIG. 16 is a cross sectional view of the principal part during the manufacturing process of the semiconductor device following the step of FIG. 15.

Next, as shown in FIG. 16, in the memory region Rm, the n-type memory extension region ex1 is formed in the principal plane s1 of the silicon substrate 1 in the p well pw1, of the lateral lower part of the memory gate electrode MG1. Here, the peripheral region Rp over the silicon substrate 1 is covered by a photoresist film 12 in advance. Then, ion implantation dp5 is performed with the photoresist film 12 as an ion implantation mask.

In this case, in the memory region Rm, the memory gate electrode MG1 serves as an ion implantation mask for the ion implantation dp5. Accordingly, an impurity can be introduced to a lateral lower region of the memory gate electrode MG1 of the principal plane s1 of the silicon substrate 1 by the ion implantation dp5. Subsequently, performing a heat treatment diffuses and activates the introduced impurity to form the memory extension region ex1.

Figure 17:
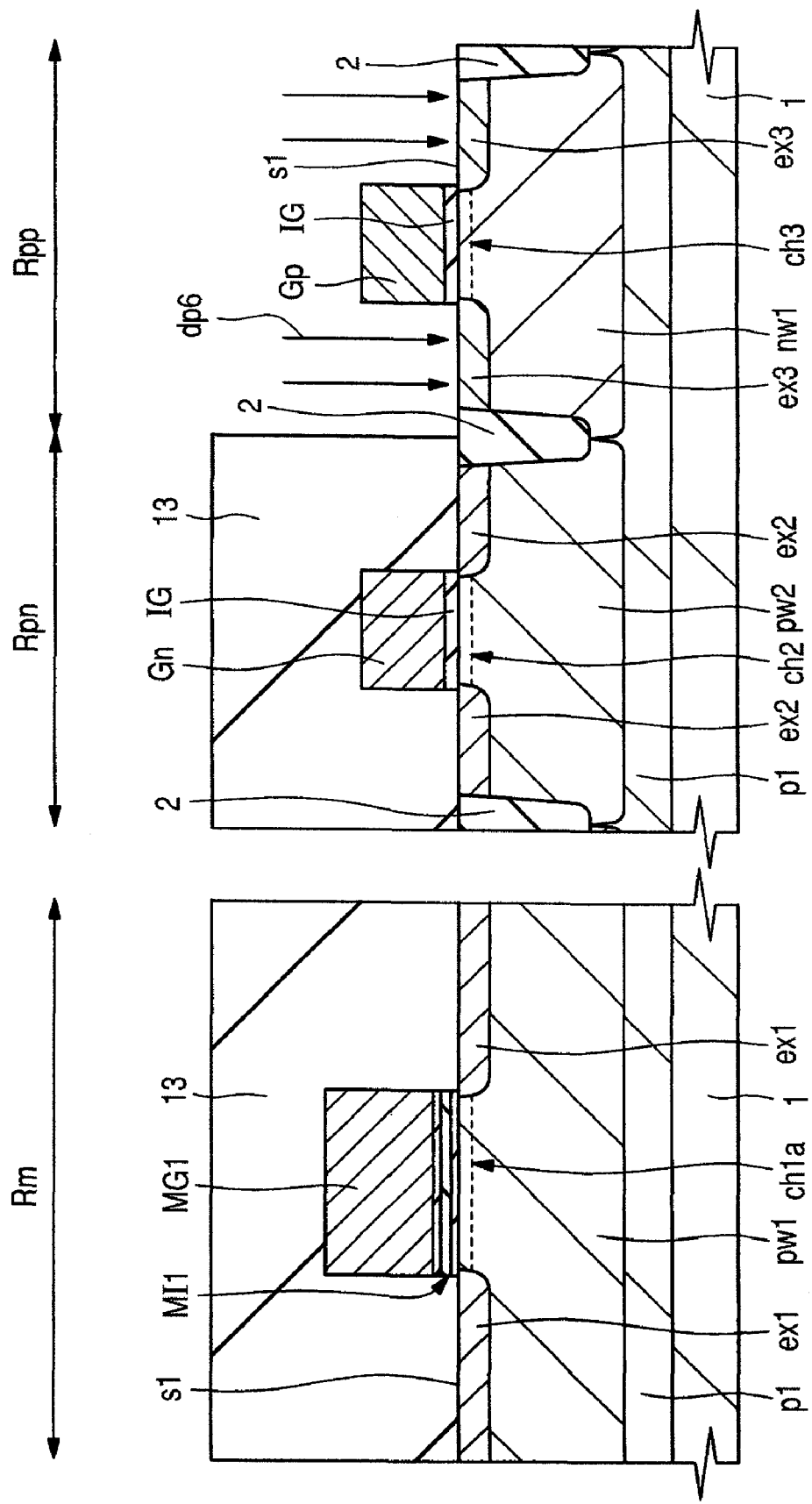
FIG. 17 is a cross sectional view of the principal part during the manufacturing process of the semiconductor device following the step of FIG. 16.

Next, as shown in FIG. 17, in the principal plane s1 of the silicon substrate 1 in the peripheral regions Rpn, Rpp, an n-type peripheral extension region ex2 is formed in the lateral lower part of the n-type peripheral gate electrode Gn, and a p-type peripheral extension region ep3 is formed in the lateral lower part of the p-type peripheral gate electrode Gp. The n-type peripheral extension region ex2 is an n-type semiconductor region, and the p-type peripheral extension region ex3 is a p-type semiconductor region.

These regions are formed by a method similar to the method of forming the memory extension region ex1 in the memory region Rm. That is, both peripheral extension regions ex2, ex3 are formed by performing ion implantation dp6 with a photoresist film 13 as an ion implantation mask, followed by performing a heat treatment for diffusion and activation. The view shows that the p-type peripheral extension region ex3 is being formed in the p-type peripheral region Rpp, as an example.

Figure 18:
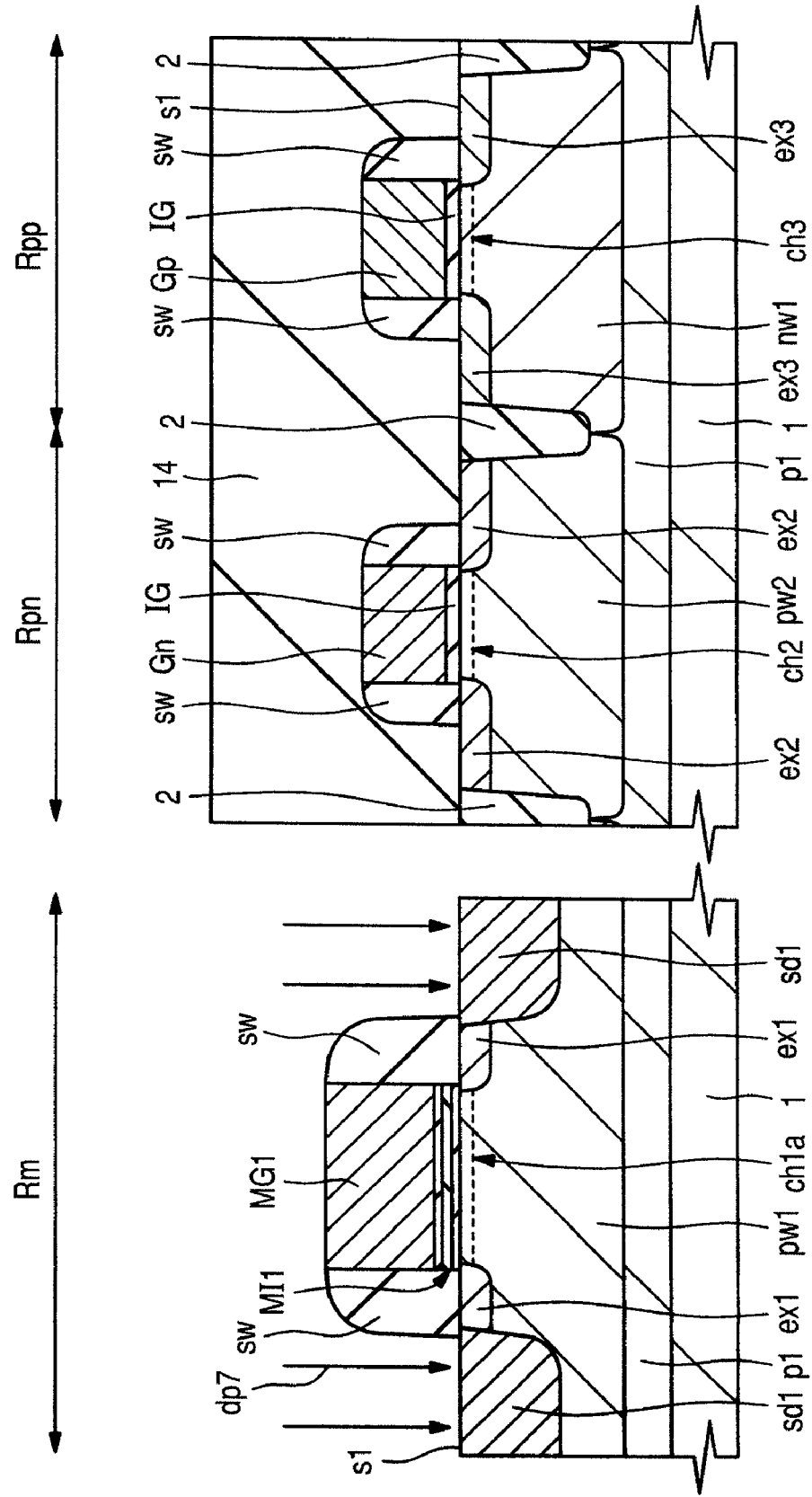
FIG. 18 is a cross sectional view of the principal part during the manufacturing process of the semiconductor device following the step of FIG. 17.

Next, as shown in FIG. 18, the side wall spacer sw is formed, over the principal plane s1 of the silicon substrate 1, at a position covering the side wall of the memory gate electrode MG1 in the memory region Rm and at a position covering the side walls of the n-type and p-type peripheral gate electrodes Gn, Gp in the peripheral regions Rpn, Rpp. The side wall spacer sw is formed using a silicon oxide based insulating film. For example, the side wall spacer sw as described above can be formed by depositing a silicon oxide film over the silicon substrate 1 by CVD and extensively performing anisotropic etching (performing etchback).

Note that, as described using FIG. 1, in order for the side wall spacer sw to have a stress, the side wall spacer sw may comprise a three-layer structure of a silicon oxide film, a silicon nitride film, and a silicon oxide film. In this case, by performing etchback after forming the above-described three layers by CVD or the like, the side wall spacer sw having the above-described three-layer structure can be formed. The subsequent step will be described assuming that the side wall spacer sw comprising only silicon oxide film has been formed in this step.

Subsequently, in the memory region Rm, the n-type memory source/drain region sd1 is formed in the principal plane s1 of the silicon substrate 1 in the p well pw1 and also at an outer position of the memory extension region ex1 in a planar view, of the lateral lower part of the memory gate electrode MG1. Here, the peripheral region Rp over the silicon substrate 1 is covered by a photoresist film 14. Then, ion implantation dp7 is performed with the photoresist film 14 as an ion implantation mask.

In this case, in the memory region Rm, the memory gate electrode MG1 and the side wall spacer sw serve as an ion implantation mask for the ion implantation dp7. Accordingly, an impurity can be introduced into a lateral lower region of the side wall spacer sw of the principal plane s1 of the silicon substrate 1 by the ion implantation dp7. As a result, this region is outside the memory extension region ex1 in a planar view. Subsequently, performing a heat treatment diffuses and activates the introduced impurity to form the memory source/drain region sd1. Here, the memory source/drain region sd1 is formed so as to have a higher n-type impurity concentration than that of the memory extension region ex1 and at the same time so as to be deeper than the depth of the memory extension region ex1.

Figure 19:
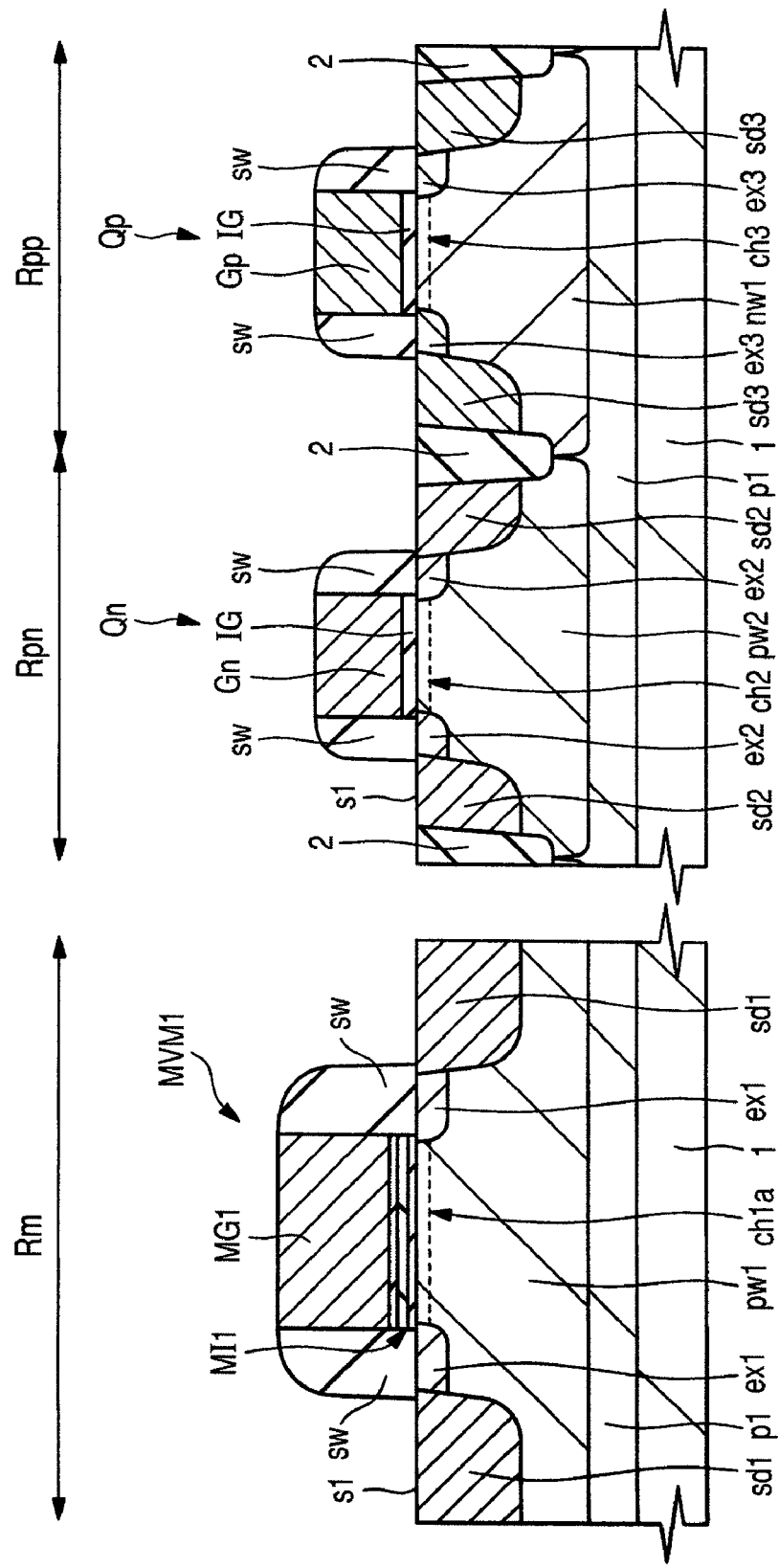
FIG. 19 is a cross sectional view of the principal part during the manufacturing process of the semiconductor device following the step of FIG. 18.

Next, as shown in FIG. 19, in the principal plane s1 of the silicon substrate 1 of the n-type peripheral region Rpn, an n-type periphery source/drain region sd2 is formed at an outer position of the n-type peripheral extension region ex2 in a planar view, in a lateral lower part of the n-type peripheral gate electrode Gn. Moreover, in the principal plane s1 of the silicon substrate 1 of the p-type peripheral region Rpp, a p-type peripheral source/drain region sd3 is formed at an outer position of the p-type peripheral extension region ex3 in a planar view, in a lateral lower part of the p-type peripheral gate electrode Gp. The n-type peripheral source/drain region sd2 is an n-type semiconductor region and the p-type peripheral source/drain region sd3 is a p-type semiconductor region.

These regions are formed by ion implantation and heat treatment by a method similar to the method of forming the memory source/drain region sd1 in the memory region Rm. Here, the n-type peripheral source/drain region sd2 is formed so as to have a higher n-type impurity concentration than that of the n-type peripheral extension region ex2 and at the same time so as to be deeper than the depth of the n-type peripheral extension region ex2. Moreover, the p-type peripheral source/drain region sd3 is formed so as to have a higher p-type impurity concentration than that of the p-type peripheral extension region ex3 and at the same time so as to be deeper than the depth of the p-type peripheral extension region ex3.

In this way, the nonvolatile memory cell NVM1 of Embodiment 1 can be formed in the memory region Rm of the silicon substrate 1. Moreover, an n-type MIS transistor Qn can be formed in the n-type peripheral region Rpn of the silicon substrate 1, and a p-type MIS transistor Qp can be formed in the p-type peripheral region Rpp.

In particular, in the step described using FIG. 7, fluorine is implanted into the memory channel region ch1a by the first ion implantation dp1a and by activating this fluorine by the first heat treatment. In this manner, the dangling bonds and defects in the memory channel region ch1a can be deactivated. Thus, in the nonvolatile memory cell NVM1 of Embodiment 1, the charge stored in the charge storage film MI1 is unlikely to leak out, so that the retention characteristic can be improved. As a result, the characteristics of the semiconductor device having the nonvolatile memory can be improved further.

In the manufacturing method of Embodiment 1, if the first ion implantation dp1a and the first heat treatment for introducing fluorine into the memory channel region ch1a are performed at least after the p well pw1 is formed in the principal plane s1 of the silicon substrate 1 in the memory region Rm, then the same effects as those described above can be obtained regardless of their timings.

For example, for the purpose of adjusting the threshold voltage of the p-type MIS transistor Qp formed in the p-type peripheral region Rpp, fluorine may be introduced into the peripheral channel region ch3. In this case, the above-described manufacturing method further includes a step of ion implanting fluorine into the peripheral channel region ch3, and a step of performing a heat treatment for diffusion and activation. The timing at which fluorine is ion-implanted into the peripheral channel region ch3 is preferably before or after the step of implanting ions into the p-type peripheral region Rpp, as with the ion implantation dp3 of FIG. 9, for example. Thus, by using the photoresist film 5 or the like for opening the p-type peripheral region Rpp also as the ion implantation mask, the number of steps can be reduced. The dosage of fluorine in this case is on the order of $1 \times 10^{15}$ cm$^{-2}$. Moreover, the heat treatment for diffusion and activation may be combined with the heat treatment (e.g., the thermal oxidation step for forming the peripheral gate insulating film IG) that is performed in other step. This can reduce the number of steps.

Embodiment 2

In Embodiment 2, various kinds of methods for introducing fluorine into the memory channel region ch1a in the nonvolatile memory cell NVM1 of the semiconductor device of Embodiment 1 will be described. Hereinafter, as an intermediate step of the process of forming the nonvolatile memory cell NVM1, the manufacturing method of Embodiment 2 is described. The steps other than this, however, are the same as those described in Embodiment 1, and the duplicate description is omitted.

First, the method of introducing fluorine described in the manufacturing method of Embodiment 1 will be described in more detail from a different point of view. As described in the manufacturing method of Embodiment 1, if the first ion implantation dp1a and the first heat treatment are performed at least after the p well pw1 is formed, these implantation and treatment are effective in deactivating the dangling bonds in the memory channel region ch1a and improving the retention characteristic.

However, as described in Embodiment 1, the first ion implantation dp1a for implanting fluorine into the memory channel region ch1a is more preferably performed after the formation of the p well pw1 and before the formations of the charge storage film MI1 and the memory gate electrode MG1, because fluorine can be implanted into the memory channel region ch1a without causing any damage of the first ion implantation dp1a to the charge storage film MI1 and the like. This allows a higher quality charge storage film MI1 to be applied to the nonvolatile memory cell NVM1. As a result, the characteristics of the semiconductor device having the nonvolatile memory can be improved further.

Furthermore, since there is no damage to the charge storage film MI1 and the like, the first ion implantation dp1a can be performed with a higher dosage. Thus, fluorine can be introduced into the memory channel region ch1a more efficiently, and the retention characteristic of the nonvolatile memory cell NVM1 can be improved further. As a result, the characteristics of the semiconductor device having the nonvolatile memory can be improved further.

Moreover, in this case, the first heat treatment for activating the fluorine implanted into the memory channel region ch1a is more preferably performed in conjunction with the heat treatment required in either of the subsequent steps. This reason will be described below.

In Embodiment 1, in order to form the silicon oxide film 6 (FIG. 10), the lower barrier film Bb1 (FIG. 12), or the upper barrier film Bt1 (FIG. 12) after performing the first ion implantation dp1a in the step of FIG. 7, the thermal oxidation step is performed. These thermal oxidation steps require heating at temperature similar to the temperature (about 800 to 1100° C.) of the first heat treatment for activating the fluorine in the memory channel region ch1a as described above. Accordingly, the first heat treatment of Embodiment 1 can be performed in the same step as the thermal oxidation step for forming each of the silicon oxide films described above. Thus, in Embodiment 1, even if the memory channel region ch1a is configured to introduce fluorine therein, the same effect can be obtained without adding any special heat treatment and consequently the number of steps can be reduced further.

Note that, if the first ion implantation ch1a is performed to the memory channel region ch1a after the p well pw1 is formed in the memory region Rm as in Embodiment 1, the existing heat treatment that can serve as the first heat treatment is not limited to the above described one. For example, also in the step of forming the memory extension region ex1 of FIG. 16 or the step of forming the memory source/drain region sd1 of FIG. 18, a heat treatment step for diffusing and activating the introduced impurity is required. Also these heat treatment steps have the same effect as that of the first heat treatment.

Next, another method of introducing fluorine into the memory channel region ch1a will be described using FIG. 20. However, in this method, the first ion implantation dp1a and the first heat treatment are not performed in the step of FIG. 7.

Figure 20:
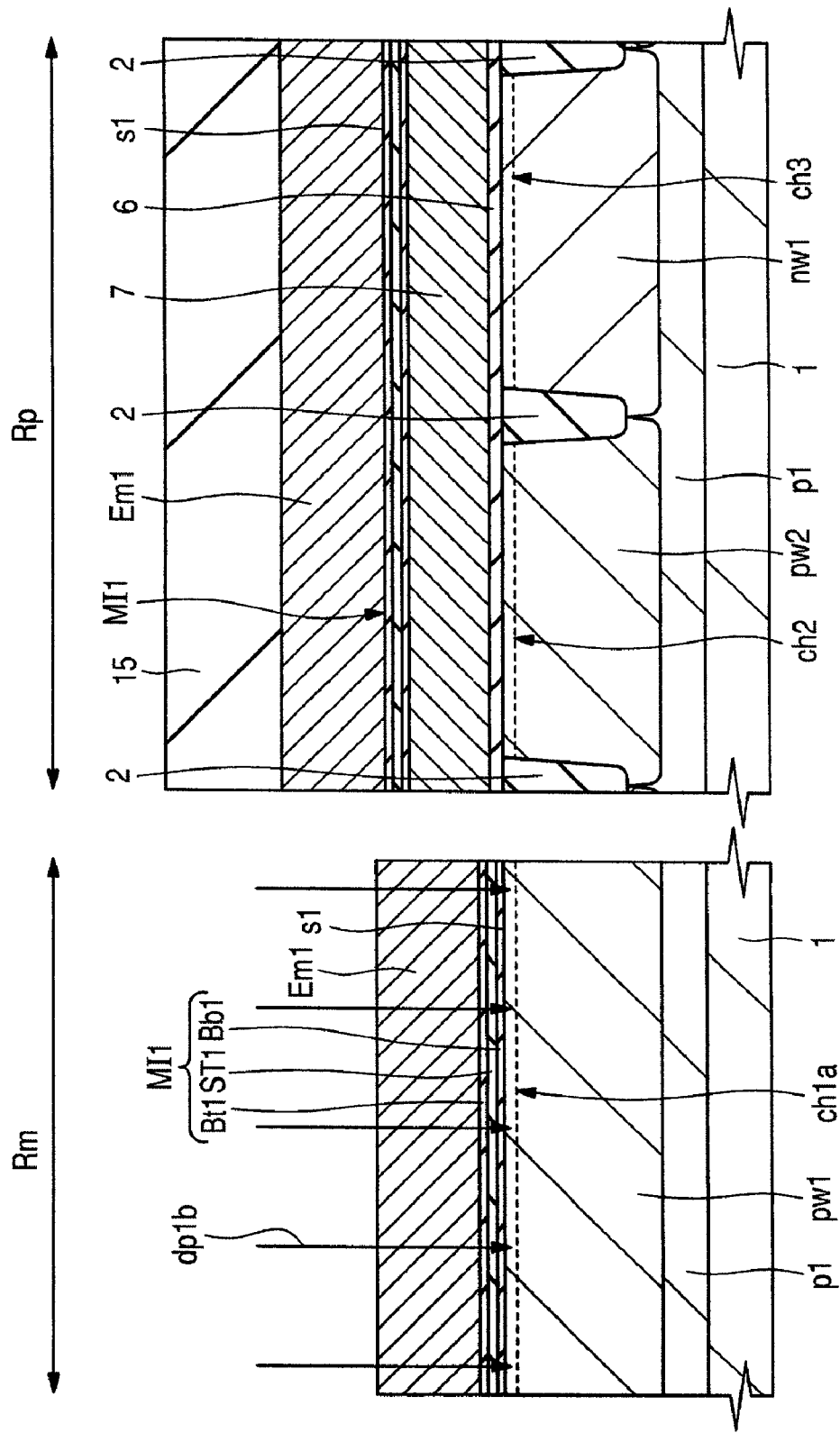
FIG. 20 is a cross sectional view of the principal part in a step following the step of FIG. 12, during the manufacturing process of a semiconductor device of Embodiment 2 according to the present invention.

FIG. 20 shows a step following the step of FIG. 12. Here, after the memory gate conductive film Em1 is formed in the step of FIG. 12, the first ion implantation dp1b is performed before this film is processed as the memory gate electrode MG1 in the step of FIG. 13. In this manner, fluorine is implanted into the memory channel region ch1a. In order to do this, first, a photoresist film 15 is formed which is patterned so as to cover the memory gate conductive film Em1 in the peripheral region Rp and open the memory region Rm. Subsequently, the first ion implantation dp1b is performed with the photoresist film 15 as an ion implantation mask. Here, by performing the first ion implantation dp1b so as to pass through the memory gate conductive film Em1 and the charge storage film MI1, fluorine can be implanted into the memory channel region ch1a. Then, a first heat treatment similar to the first heat treatment of Embodiment 1 is performed to activate the introduced fluorine.

Also with the method as described above, the effect of introducing fluorine into the memory channel region ch1a as described in Embodiment 1 can be obtained as well.

According to the verification of the present inventor, in this step, it is more effective to introduce fluorine with a dosage of about $1 \times 10^{13}$ to $1 \times 10^{15}$ cm$^{-2}$ as the first ion implantation dp1b. Moreover, it is more effective to perform the first ion implantation dp1b with such an acceleration energy that the peak of the concentration distribution of the implanted fluorine comes to a position within 50 nm depth from the principal plane s1 of the silicon substrate 1.

Hereinafter, in the manufacturing method of Embodiment 2, the effect of implanting fluorine into the memory channel region ch1a by performing the first ion implantation dp1b at the above-described timing different from that of the manufacturing method of Embodiment 1 will be described.

In terms of the purpose of deactivating the dangling bonds in the memory channel region ch1a, it is not desirable for the implanted fluorine to be away from the vicinity of the principal plane s1 of the silicon substrate 1 directly beneath the charge storage film MI1. However, the fluorine implanted into the memory channel region ch1a will be diffused by various kinds of heat treatments. Accordingly, after implanting fluorine ions into the memory channel region ch1a, it is more preferable to perform the first heat treatment sufficient to activate the fluorine ions and not to perform other excessive heat treatment.

Here, the thermal oxidation step for forming the silicon oxide films, such as the lower barrier film Bb1 and the upper barrier film Bt1, requires heat treatment at higher temperatures. From this viewpoint, according to the step of FIG. 20, the first ion implantation dp1b can be performed at least after the formation of the charge storage film MI1. That is, it is possible to avoid the thermal oxidation step for forming the above-described silicon oxide film and perform the first ion implantation dp1b of fluorine. Thus, the diffusion beyond a desired region of the fluorine implanted into the memory channel region ch1a can be suppressed. Thereby, the dangling bonds and the like in the memory channel region ch1a can be deactivated more efficiently, and the retention characteristic of the nonvolatile memory cell NVM1 can be improved further. As a result, the characteristics of the semiconductor device having the nonvolatile memory can be improved further.

Next, yet another method of introducing fluorine into the memory channel region ch1a will be described using FIG. 21. However, in this method, the first ion implantations dp1a, dp1b and the first heat treatment are not performed in the step of FIG. 7 or FIG. 20.

Figure 21:
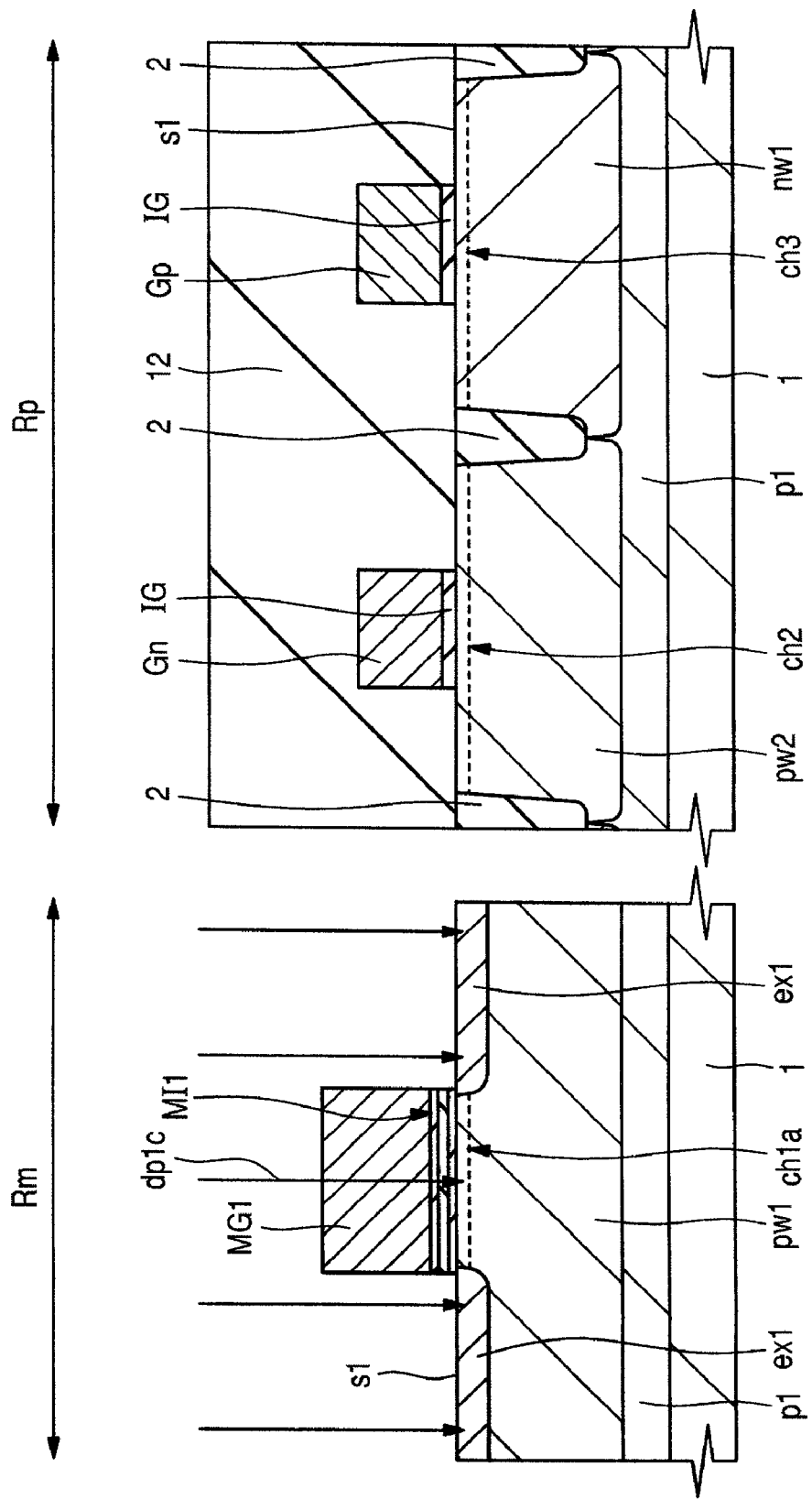
FIG. 21 is a cross sectional view of the principal part in a step following the step of FIG. 16, during the manufacturing process of the semiconductor device of Embodiment 2 according to the present invention.

FIG. 21 shows a step following the step of FIG. 16. Here, first ion implantation dp1c is performed immediately after the ion implantation dp5 for forming the memory extension region ex1 is performed in the step of FIG. 16. Thereby, fluorine is implanted into the memory channel region ch1a. Here, by performing the first ion implantation dp1c so as to pass through the memory gate electrode MG1 and the charge storage film MI1, it is possible to implant fluorine into the memory channel region ch1a. Then, a first heat treatment similar to the first heat treatment of Embodiment 1 is performed and the introduced fluorine is activated.

Also with the method as described above, the effect of introducing fluorine into the memory channel region ch1a as described in Embodiment 1 can be obtained as well.

According to the verification of the present inventor, in this step, it is more effective to introduce fluorine with a dosage of about $1 \times 10^{13}$ to $1 \times 10^{15}$ cm$^{-2}$ as the first ion implantation dp1c. Moreover, it is more effective to perform the first ion implantation dp1c with such an acceleration energy that the peak of the concentration distribution of the implanted fluorine comes to a position within 50 nm depth from the principal plane s1 of the silicon substrate 1.

Hereinafter, in the manufacturing method of Embodiment 2, the effect of implanting fluorine into the memory channel region ch1a by performing the first ion implantation dp1c at the above-described timing different from those of the manufacturing method of Embodiment 1 and the method described using FIG. 20 will be described.

As described above, it is more preferable not to perform an excessive heat treatment after introducing fluorine into the memory channel region ch1a. From this viewpoint, according to this step, the first ion implantation dp1c can be performed in a later step as compared with the first ion implantations dp1a, dp1b of Embodiment 1 and FIG. 20. This makes it possible to avoid the thermal oxidation step that requires a high temperature as well as the heat treatment step (FIG. 14) and the like for the activation and diffusion of the impurity implanted into the polysilicon film 7. Accordingly, the diffusion beyond a desired region of the fluorine implanted into the memory channel region ch1a can be suppressed further. Thereby, the dangling bonds and the like in the memory channel region ch1a can be deactivated more efficiently, and the retention characteristic of the nonvolatile memory cell NVM1 can be improved further. As a result, the characteristics of the semiconductor device having the nonvolatile memory can be improved further.

Moreover, in the first ion implantation dp1c for implanting fluorine in this step, the ion implantation is performed to the same region as in the ion implantation dp5 for forming the memory extension region ex1. Therefore, the photoresist film 12 already formed as the ion implantation mask can be also used. This can reduce the number of steps. From this viewpoint, in the above method, the first ion implantation dp1c is performed immediately after the ion implantation dp5, however, the first ion implantation dp1c may be performed after the formation of the photoresist film 12 and immediately before the ion implantation dp5.

Moreover, the first heat treatment for activating the fluorine implanted by the first ion implantation dp1c of this step is more preferably performed in the same step as the heat treatment for forming the memory extension region ex1, because this eliminates the need to add a new first heat treatment specialized in activating fluorine and can reduce the number of steps. In addition, according to the verification of the present inventor, since the heat treatment for forming the memory extension region ex1 is performed at the same temperature range as that of the first heat treatment for activating the fluorine that was implanted into the memory channel region ch1a, these heat treatments can be combined without any problem.

Next, yet another method of introducing fluorine into the memory channel region ch1a will be described using FIG. 22. However, in this method, the first ion implantations dp1a, dp1b, and dp1c, and the first heat treatment are not performed in the step of FIG. 7, FIG. 20, or FIG. 21.

Figure 22:
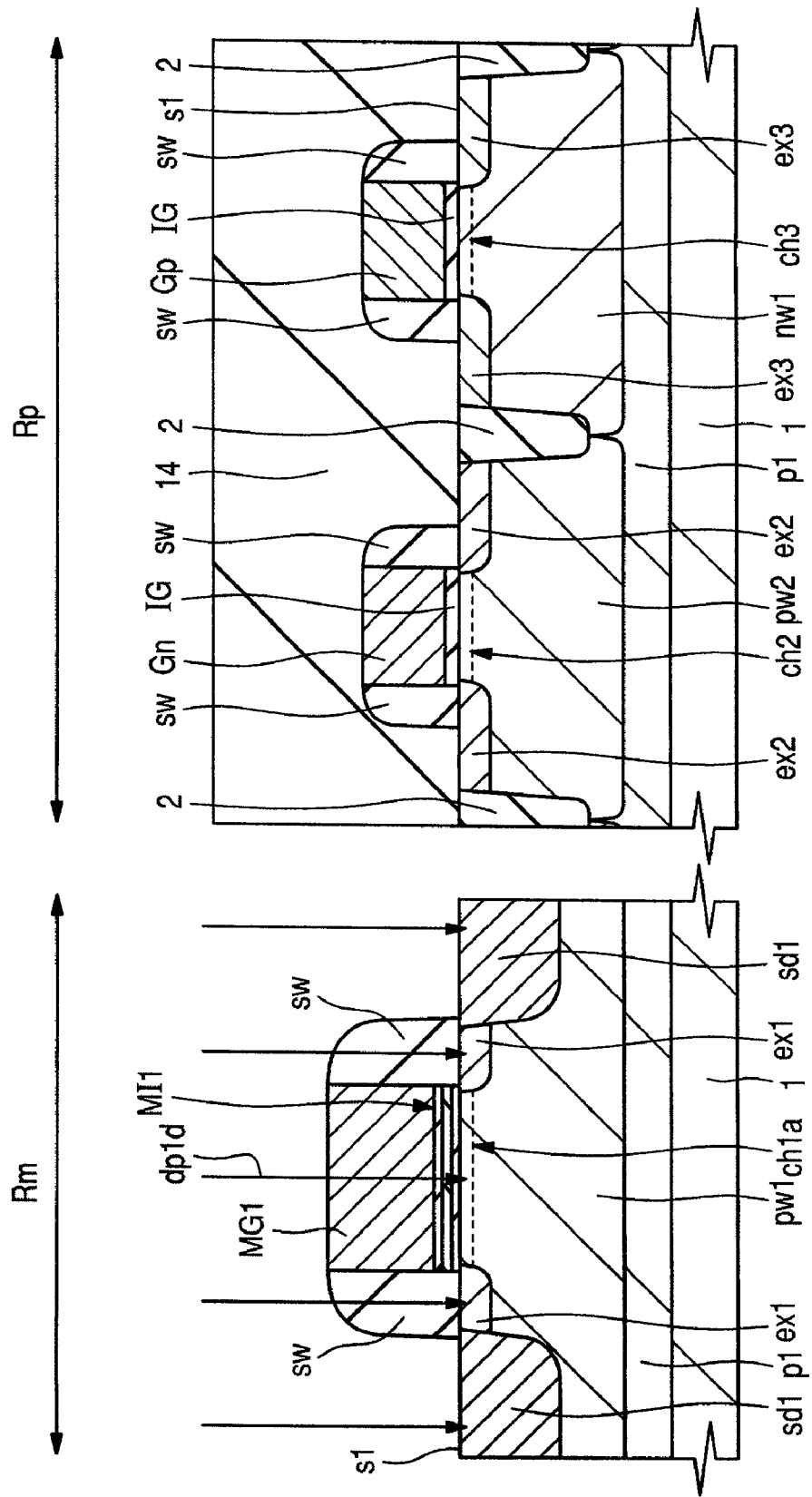
FIG. 22 is a cross sectional view of the principal part in a step following the step of FIG. 18, during the manufacturing process of the semiconductor device of Embodiment 2 according to the present invention.

FIG. 22 shows a step following the step of FIG. 18. Here, first ion implantation dp1d is performed immediately after the ion implantation dp7 for forming the memory source/drain region sd1 is performed in the step of FIG. 18. Thereby, fluorine is implanted into the memory channel region ch1a. Here, by performing the first ion implantation dp1d so as to pass through the memory gate electrode MG1 and the charge storage film MI1, it is possible to implant fluorine into the memory channel region ch1a. Then, a first heat treatment similar to the first heat treatment of Embodiment 1 is performed and the introduced fluorine is activated.

Also with the method as described above, the effect of introducing fluorine into the memory channel region ch1a as described in Embodiment 1 can be obtained as well.

According to the verification of the present inventor, in this step, it is more effective to introduce fluorine with a dosage of about $1 \times 10^{13}$ to $1 \times 10^{15}$ cm$^{-2}$ as the first ion implantation dp1d. Moreover, it is more effective to perform the first ion implantation dp1d with such an acceleration energy that the peak of the concentration distribution of the implanted fluorine comes to a position within 50 nm depth from the principal plane s1 of the silicon substrate 1.

Hereinafter, in the manufacturing method of Embodiment 2, the effect of implanting fluorine into the memory channel region ch1a by performing the first ion implantation dp1d at the above-described timing different from those of the manufacturing method of Embodiment 1, the method described using FIG. 20, and the method described using FIG. 21 will be described.

As described above, it is more preferable not to perform an excessive heat treatment after introducing fluorine into the memory channel region ch1a. From this viewpoint, according to this step, the first ion implantation dp1d can be performed in a later step as compared with the first ion implantations dp1a, dp1b, and dp1c of Embodiment 1, FIG. 20, and FIG. 21. This makes it possible to avoid the thermal oxidation step that requires a high temperature as well as the heat treatment step (FIG. 16) and the like for the activation and diffusion of the impurity implanted as the memory extension region ex1. Accordingly, the diffusion beyond a desired region of the fluorine implanted into the memory channel region ch1a can be suppressed further. Thereby, the dangling bonds and the like in the memory channel region ch1a can be deactivated more efficiently, and the retention characteristic of the nonvolatile memory cell NVM1 can be improved further. As a result, the characteristics of the semiconductor device having the nonvolatile memory can be improved further.

Moreover, in the first ion implantation dp1d for implanting fluorine in this step, the ion implantation is performed to the same region as in the ion implantation dp7 for forming the memory source/drain region sd1. Accordingly, the photoresist film 14 already formed as the ion implantation mask can be also used. This can reduce the number of steps. From this viewpoint, in the above method, the first ion implantation dp1d is performed immediately after the ion implantation dp7, however, the first ion implantation dp1d may be performed after the formation of the photoresist film 14 and immediately before the ion implantation dp7.

Moreover, the first heat treatment for activating the fluorine implanted by the first ion implantation dp1d of this step is more preferably performed in the same step as the heat treatment for forming the memory source/drain region sd1, because this eliminates the need to add a new first heat treatment specialized in activating fluorine and can reduce the number of steps. In addition, according to the verification of the present inventor, since the heat treatment for forming the memory source/drain region sd1 is performed at the same temperature range as that of the first heat treatment for activating the fluorine implanted into the memory channel region ch1a, these heat treatments can be combined without any problem.

Embodiment 3

Figure 23:
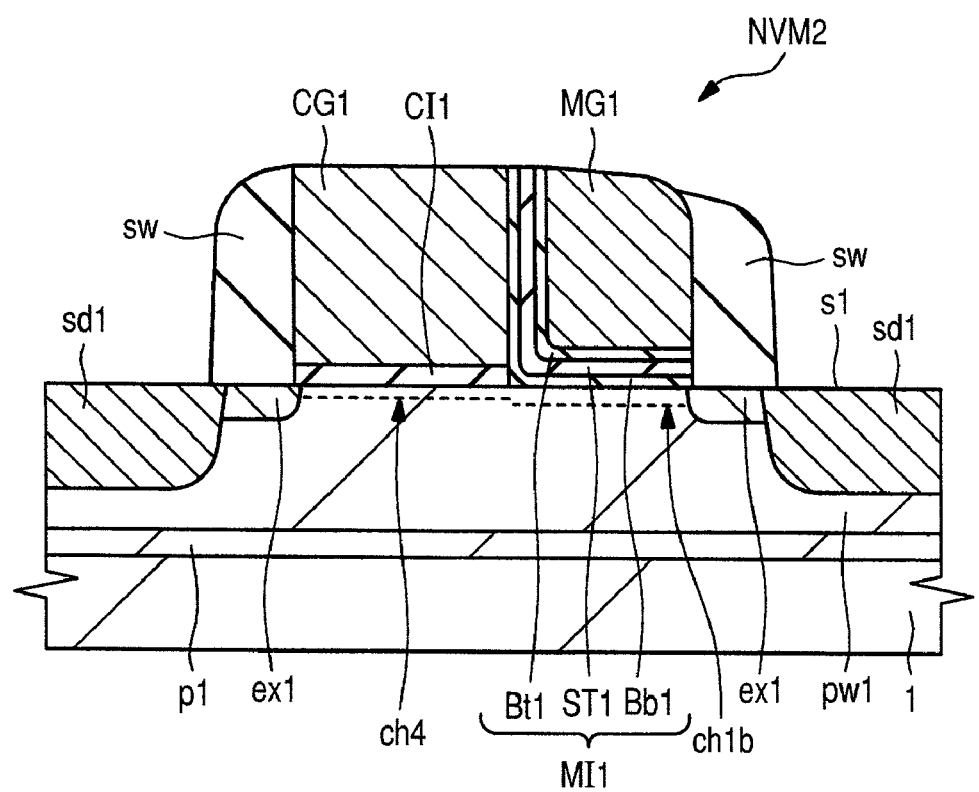
FIG. 23 is a cross sectional view of a principal part of a semiconductor device of Embodiment 3 according to the present invention.

A structure of a nonvolatile memory cell of a semiconductor device of Embodiment 3 will be described in detail using FIG. 23. FIG. 23 is a cross sectional view of a principal part of a nonvolatile memory cell NVM2 of Embodiment 3. The nonvolatile memory cell NVM2 of Embodiment 3 has the following different configuration as compared with that of the nonvolatile memory cell NVM1 of Embodiment 1.

The nonvolatile memory cell NVM2 of Embodiment 3 includes a control gate electrode CG1 disposed across a control gate insulating film CI1 at a position included in the p well pw1 in a planar view, over the principal plane of the silicon substrate 1. The control gate insulating film CI1 comprises a silicon oxide based insulating film, and the control gate electrode CG1 comprises a polysilicon based conductive film.

Then, the memory gate electrode MG1 is disposed so as to be adjacent to the control gate electrode CG1 across the charge storage film MI1. In other words, the memory gate electrode MG1 and the control gate electrode CG1 are adjacent to each other, and the charge storage film MI1 is integrally disposed from between the silicon substrate 1 and the memory gate electrode MG1 throughout between the control gate electrode CG1 and the memory gate electrode MG1.

Moreover, the memory extension region ex1 and the memory source/drain region sd1 are disposed in the lateral lower part where these regions are not adjacent to each other, of the principal plane s1 of the silicon substrate 1 of the lower lateral parts of the memory gate electrode MG1 and the control gate electrode CG1. In other words, the mutually adjacent memory gate electrode MG1 and control gate electrode CG1 are disposed so as to be sandwiched by the memory extension region ex1 and the memory source/drain region sd1 in the p well pw1 in a planar view.

Moreover, the side wall spacer sw is disposed so as to cover, of the side walls of the memory gate electrode MG1 and the control gate electrode CG1, a side wall where these electrodes are not adjacent to each other, over the principal plane s1 of the silicon substrate 1.

The aforementioned is the configuration that differs from that of the nonvolatile memory cell NVM1 of Embodiment 1, in the configuration of the nonvolatile memory cell NVM2 of Embodiment 3. The configurations and their functions not referred to in the above are the same as those of the nonvolatile memory cell NVM1 of Embodiment 1.

The nonvolatile memory cell NVM2 having a structure as described above can be regarded as an ordinary MIS transistor if the memory gate electrode MG1 and the control gate electrode CG1 are regarded as one gate electrode. In other words, the nonvolatile memory cell NVM2 of Embodiment 3 is configured in such a manner that the gate electrode of an MIS transistor is divided into two (split gate) so that a voltage can be applied to each of the two gates independently. Furthermore, one of the gates (comprising the memory gate electrode MG1 and the charge storage film MI1) can store a charge and perform the memory operation, and the other gate electrode can control the transferring of this charge more intricately.

In particular, the nonvolatile memory cell NVM2 of Embodiment 3 can, with regard to the write and erase operations, operate using a hot carrier unlike the operation by FN tunneling that was described using FIG. 2, FIG. 3. These operations are known as the write operation by SSI (Source Side Injection) and the erase operation by BTBT (Band To Band Tunneling) in the split gate MONOS type memory. Here, the detailed description thereof is omitted. In the nonvolatile memory cell NVM2 of Embodiment 3, since the memory operation by these SSI and BTBT is possible, the MONOS type memory having higher speed and lower power consumption can be configured. As a result, the characteristics of the semiconductor device having the nonvolatile memory can be improved further.

The nonvolatile memory cell NVM2 of Embodiment 3 having such an effect further includes the following configuration. That is, a memory channel region ch1$b$ that is a region of the principal plane s1 of the silicon substrate 1 directly beneath the charge storage film MI1 contains fluorine. This is the same as the configuration of the memory channel region ch1$a$ of the nonvolatile memory cell NVM1 of Embodiment 1, and the feature and effect thereof are also the same. That is, the nonvolatile memory cell NVM2 can be constructed in such a manner that the silicon substrate 1 causes a charge trapped by the charge storage film MI1 to be unlikely to leak out. This can improve the retention characteristic of the nonvolatile memory cell NVM2 of Embodiment 3. As a result, the characteristics of the semiconductor device having the nonvolatile memory can be improved further.

Note that, a control channel region ch4 that is a region of the principal plane s1 of the silicon substrate 1 directly beneath the control gate insulating film CI1 may also contain fluorine similarly. However, it is enough to obtain the above-described effect if the memory channel region ch1$b$ contains fluorine.

Hereinafter, a method of manufacturing a semiconductor device having the nonvolatile memory cell NVM2 of Embodiment 3 will be described. Here, the step of forming two cells of the nonvolatile memory cell NVM2 over the silicon substrate 1 is described. Note that, the MIS transistors constituting the peripheral circuit will be formed over the same silicon substrate 1, however, since the method thereof is the same as the method described in Embodiment 1, the duplicate description here is omitted.

Figure 24:
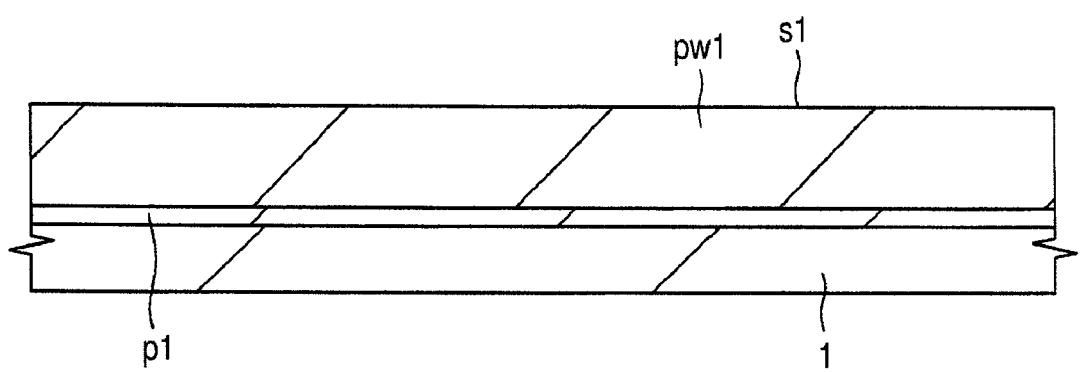
FIG. 24 is a cross sectional view of the principal part during the manufacturing process of the semiconductor device of Embodiment 3 according to the present invention.

First, as shown in FIG. 24, the p-type semiconductor region p1 is formed over the principal plane s1 of the silicon substrate 1, and further the p well pw1 for forming the nonvolatile memory cell NVM2 is formed. These are formed as in the steps described in FIG. 6, FIG. 7 of Embodiment 1.

Figure 25:
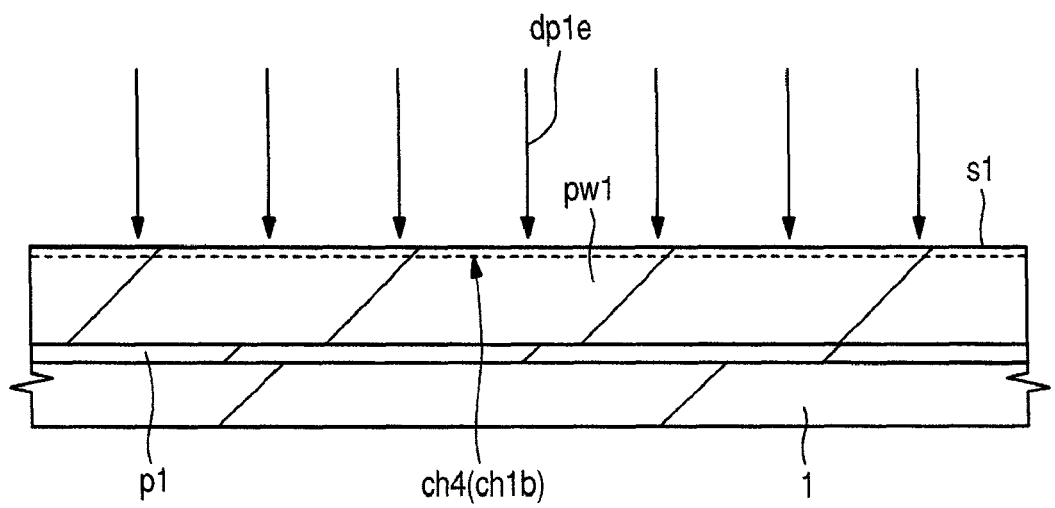
FIG. 25 is a cross sectional view of the principal part during the manufacturing process of the semiconductor device following the step of FIG. 24.

Next, as shown in FIG. 25, ion implantation is performed to obtain a control channel region ch4 having a desired impurity concentration. As described in FIG. 23, the control channel region ch4 is the region located beneath the control gate insulating film CI1 to be formed later and where the inversion layer is formed, of the principal plane s1 of the silicon substrate 1. At the stage of this step, the control gate insulating film CI1 has not been formed yet, so the control channel region ch4 cannot be distinguished from other principal plane s1 of the silicon substrate 1. That is, in this step, the ion implantation for adjusting the channel concentration is performed to not only a portion to later serve as the control channel region ch4 but also a portion to later serve as the memory channel region ch1$b$, for example. In the view, the region in the vicinity of the principal plane s1 of the silicon substrate 1 is denoted as the control channel region ch4 or the memory channel region ch1$b$. Here, the channel concentration is adjusted as in the step described in FIG. 7 of Embodiment 1.

Here, the manufacturing method of Embodiment 3 includes the step of introducing fluorine into the memory channel region ch1$b$, as the next step. In order to do this, fluorine is implanted into the memory channel region ch1$b$ of the principal plane s1 of the silicon substrate 1 by first ion implantation dp1$e$. Subsequently, the fluorine implanted into the channel region is activated by performing a heat treatment (a first heat treatment) at about 800 to 1100° C. Thereby, the dangling bonds, other defects, and the like contained in the memory channel region ch1$b$ and serving as a charge trap can be deactivated by fluorine. In this manner, the configuration of the nonvolatile memory cell NVM2 that exhibits the effect as described using FIG. 23 can be formed. Note that, in this step, fluorine has been introduced also into the control channel region ch4 other than the region to later serve as the memory channel region ch1$b$.

According to the verification of the present inventor, in this step, it is more effective to introduce fluorine with a dosage of about $1 \times 10^{13}$ to $1 \times 10^{15}$ cm$^{-2}$ as the first ion implantation dp1e. Moreover, it is more effective to perform the first ion implantation dp1e with such an acceleration energy that the peak of the concentration distribution of the implanted fluorine comes to a position within 50 nm depth from the principal plane s1 of the silicon substrate 1.

If the steps (the first ion implantation dp1e and the first heat treatment) of introducing fluorine having such an effect are performed at least after the formation of the p well pw1, the same effect can be obtained. However, as described above, the first ion implantation dp1e is more preferably performed before the formation of the charge storage film MI1 or the memory gate electrode MG1. This has the same effect as that described in Embodiment 2. That is, the first ion implantation dp1e can be performed without causing any damage to the charge storage film MI1. This makes it possible to apply a higher quality charge storage film MI1 to the nonvolatile memory cell NVM2. As a result, the characteristics of the semiconductor device having the nonvolatile memory can be improved further.

Figure 26:
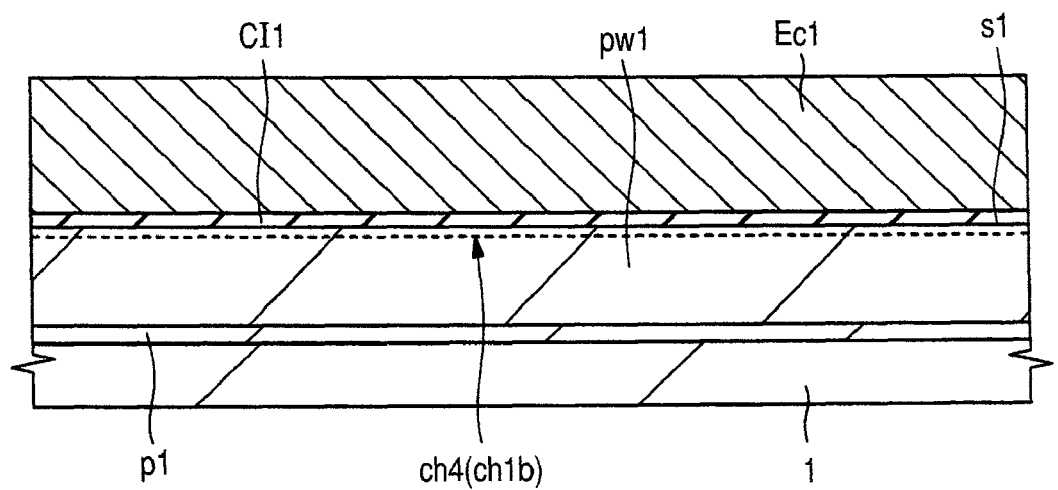
FIG. 26 is a cross sectional view of the principal part during the manufacturing process of the semiconductor device following the step of FIG. 25.

Next, as shown in FIG. 26, the control gate insulating film CI1 and a control gate conductive film Ec1 are formed sequentially over the principal plane s1 of the silicon substrate 1. The control gate conductive film Ec1 is an element that will be processed and serve as the control gate electrode CG1 in a subsequent step. Here, the control gate insulating film CI1 comprising a silicon oxide film is formed by applying a surface oxidation treatment to the principal plane s1 of the silicon substrate 1 by thermal oxidation. Then, the control gate conductive film Ec1 comprising a polysilicon film is formed by CVD. In this case, for the control gate conductive film Ec1, a polysilicon film containing impurities with the concentration required as the control gate electrode CG1 may be formed, or the impurity may be introduced by ion implantation and heat treatment after the formation of the polysilicon film.

Here, the first heat treatment for activating the fluorine described in the step of FIG. 25 is more preferably performed in the same step as the heat treatment required in forming the control gate insulating film CI1 by thermal oxidation, because this eliminates the need to add a new first heat treatment specialized in activating fluorine and can reduce the number of steps. Note that, according to the verification of the present inventor, since the thermal oxidation for forming the control gate insulating film CI1 is performed at the same temperature range as that of the first heat treatment for activating the fluorine implanted into the memory channel region ch1b, these heat treatments can be combined without any problem.

Figure 27:
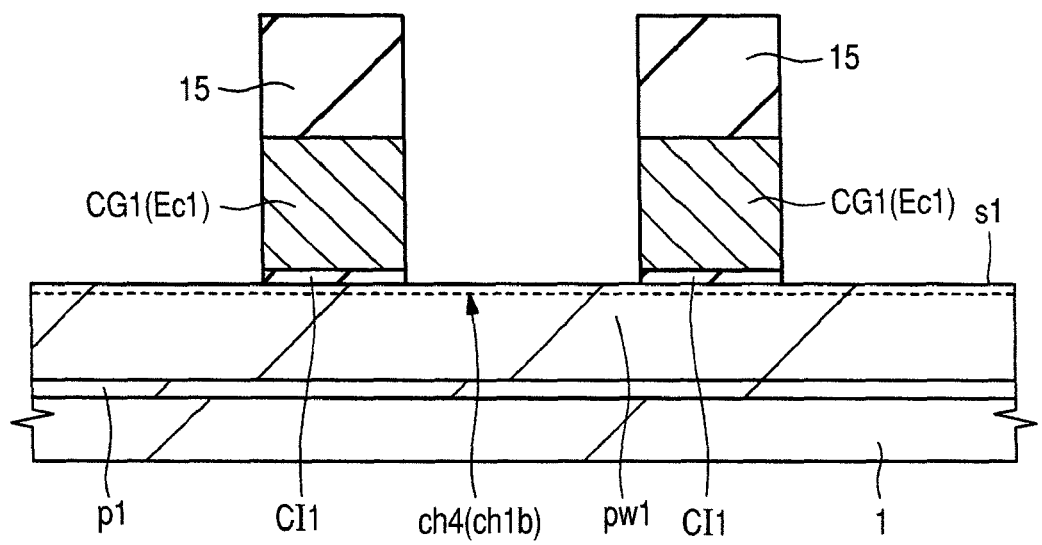
FIG. 27 is a cross sectional view of the principal part during the manufacturing process of the semiconductor device following the step of FIG. 26.

Next, as shown in FIG. 27, the control gate electrode CG1 is formed by processing the control gate conductive film Ec1. In order to this, first, a photoresist film 15 that is patterned so as to cover the control gate conductive film Ec1 of a portion to be remained as the control gate electrode CG1 is formed. Then, the control gate conductive film Ec1 of an exposed portion is removed by performing anisotropic etching to the control gate conductive film Ec1 with the photoresist film 15 as an etching mask. In this manner, the control gate electrode CG1 comprising the control gate conductive film Ec1 is formed.

Then, likewise, the control gate insulating film CI1 is etched with the photoresist film 15 as an etching mask. In this manner, the control gate insulating film CI1 is processed so as to be disposed between the silicon substrate 1 and the control gate electrode CG1.

Figure 28:
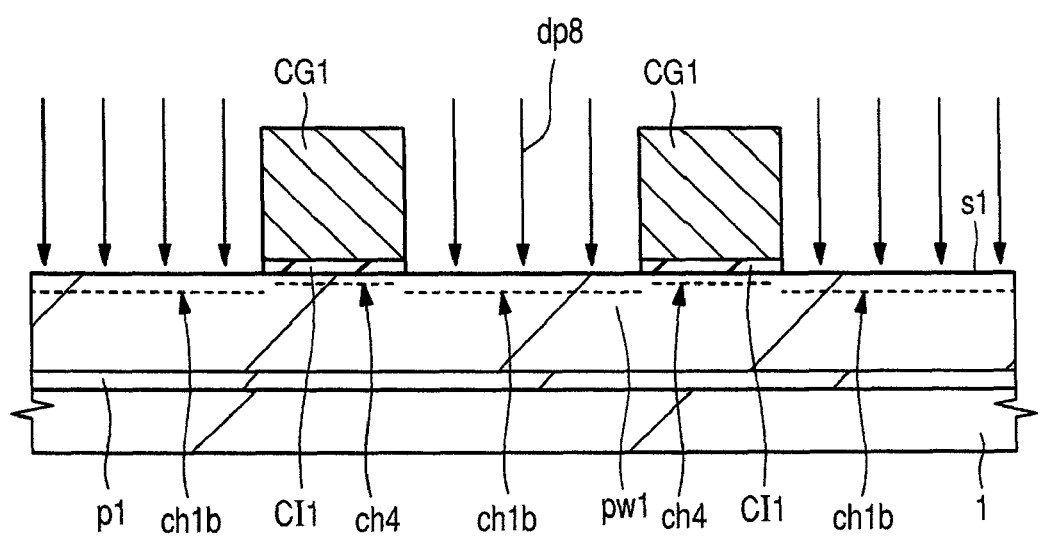
FIG. 28 is a cross sectional view of the principal part during the manufacturing process of the semiconductor device following the step of FIG. 27.

Next, as shown in FIG. 28, ion implantation dp8 for adjusting the channel concentration of the memory channel region ch1b is performed. Here, for example, a method similar to the channel concentration adjusting method described using FIG. 7 is used. However, the impurity seed and the impurity concentration are assumed to be set to the desired conditions.

Here, with respect to the control channel region ch4, the ion implantation dp8 is preferably not performed because the channel concentration has already been adjusted in the previous step. In this respect, the control gate electrode CG1 functions as an ion implantation mask, and the ion implantation dp8 will not impact on the control channel region ch4. Moreover, the whole of the vicinity of the principal plane s1 of the silicon substrate 1 of a portion not covered by the control gate electrode CG1 will not serve as the memory channel region ch1b, however, here, the ion implantation dp8 may be performed to portions including these portions, because in the portions not serving as the memory channel region ch1b, other structures will be formed by the subsequent steps.

Moreover, in the manufacturing method of Embodiment 3, the first ion implantation dp1e performed in the step of FIG. 25 may be performed immediately before or immediately after the ion implantation dp8 for adjusting the channel concentration in this step. Thereby, for example, it is possible to avoid the heat treatment required for the thermal oxidation for forming the control gate insulating film CI1 and perform the first ion implantation dp1e. The reason why an excessive heat treatment is more preferably not performed after the first ion implantation dp1e for implanting fluorine into the memory channel region ch1b is performed is as described in Embodiment 2. That is, in this step, by performing the first ion implantation dp1e immediately before or immediately after the ion implantation dp8 and avoiding the heat treatment, it is possible to further suppress the diffusion beyond a desired region. Thereby, the dangling bonds and the like in the memory channel region ch1b can be deactivated more efficiently, and the retention characteristic of the nonvolatile memory cell NVM2 can be improved further. As a result, the characteristics of the semiconductor device having the nonvolatile memory can be improved further.

Figure 29:
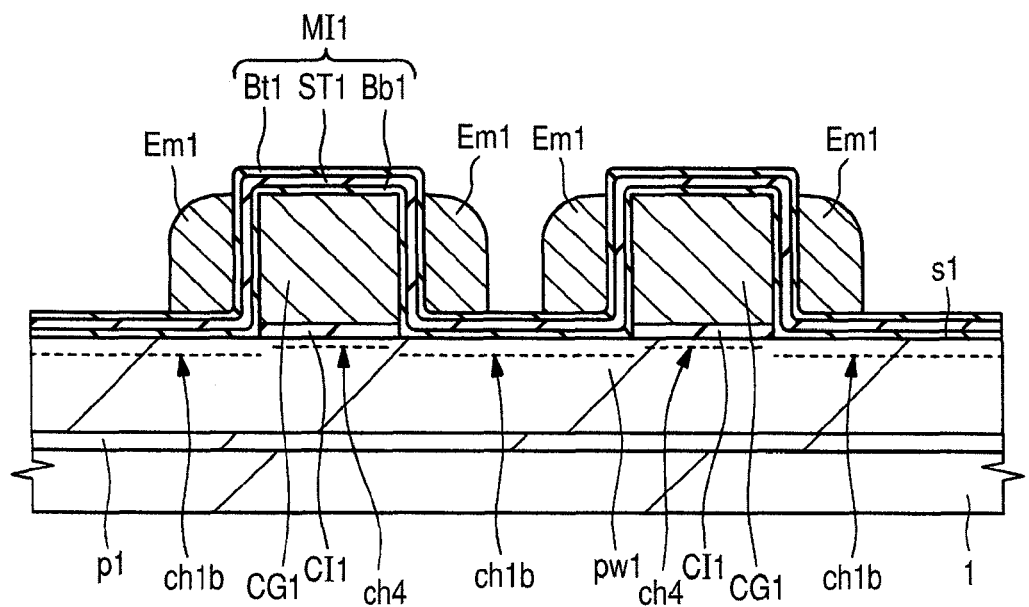
FIG. 29 is a cross sectional view of the principal part during the manufacturing process of the semiconductor device following the step of FIG. 28.

Next, as shown in FIG. 29, the charge storage film MI1 comprising the lower barrier film Bb1, the charge storage film ST1, and the upper barrier film Bt1 in this order is formed so as to cover the principal plane of the silicon substrate 1 including the control gate electrode CG1. Subsequently, the memory gate conductive film Em1 is formed so as to cover the charge storage film MI1. The detailed configurations and methods thereof are the same as those of the steps that have been described using FIG. 12 in the manufacturing method of Embodiment 1.

Then, by performing etchback of the memory gate conductive film Em1, the memory gate conductive film Em1 is processed into such a shape that covers the side wall of the control gate electrode CG1 via the charge storage film MI1.

Figure 30:
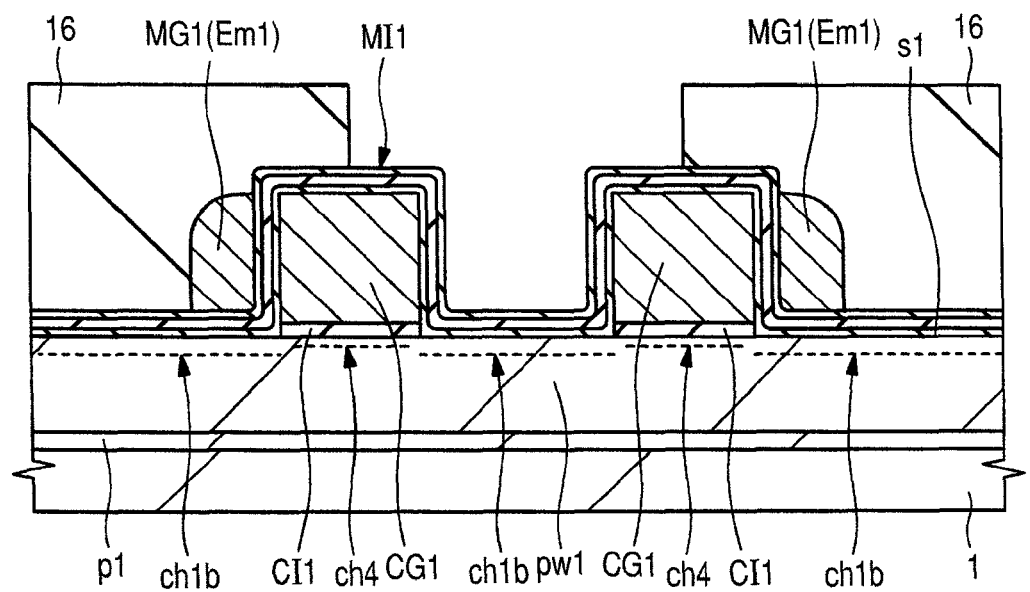
FIG. 30 is a cross sectional view of the principal part during the manufacturing process of the semiconductor device following the step of FIG. 29.

Next, as shown in FIG. 30, the memory gate electrode MG1 is formed by removing either of the memory gate conductive films Em1 covering a pair of side walls of the control gate electrode CG1. In order to do this, first, a photoresist film 16 is formed so as to cover the memory gate conductive film Em1 that will remain without being removed. Thereafter, etching is performed on the memory gate conductive film Em1 with the photoresist film 16 as an etching mask. Thus, by removing the memory gate conductive film Em1 not covered by the photoresist film 16, the memory gate electrode MG1 comprising the remaining memory gate conductive film Em1 is formed. With this step, such a memory gate electrode MG1 that is adjacent to the control gate electrode CG1 across the charge storage film MI1 can be formed.

Figure 31:
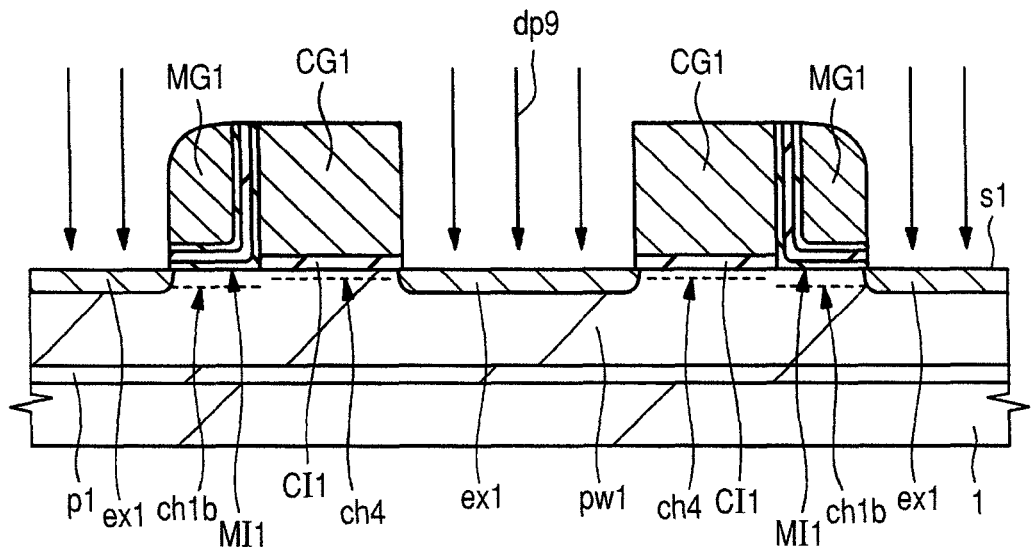
FIG. 31 is a cross sectional view of the principal part during the manufacturing process of the semiconductor device following the step of FIG. 30.

Next, as shown in FIG. 31, the charge storage film MI1 of a portion not covered by the memory gate electrode MG1 is removed. In order to do this, anisotropic etching is performed to the charge storage film MI1 with the memory gate electrode MG1 as an etching mask. With this step, the charge storage film MI1 having such a shape that is integrally disposed from between the silicon substrate 1 and the memory gate electrode MG1 throughout between the control gate electrode CG1 and the memory gate electrode MG1 can be formed.

Thereafter, the memory extension region ex1 is formed in the principal plane s1 of the silicon substrate 1 in the lateral lower parts of the memory gate electrode MG1 and the control gate electrode CG1. In order to do this, first, with the memory gate electrode MG1 and the control gate electrode CG1 as an ion implantation mask, ion implantation dp9 is performed to implant a desired impurity. Then, by performing a heat treatment for diffusing and activating the implanted impurity, it is possible to form the memory extension region ex1 in the above-described region.

Note that, for the memory extension region ex1, the required impurity concentration may differ between on the memory gate electrode MG1 side and on the control gate electrode CG side. In this case, a photoresist film as an ion implantation mask is formed (not illustrated), and the ion implantation dp9 is selectively performed to the respective regions under different conditions.

Moreover, in the manufacturing method of Embodiment 3, the first ion implantation dp1e performed in the step of FIG. 25 may be performed immediately before or immediately after the ion implantation dp9 for forming the memory extension region ex1 of this step. Thus, for example, it is possible to avoid the heat treatment required for the thermal oxidation for forming the charge storage film MI1 and perform the first ion implantation dp1e. The reason why an excessive heat treatment is more preferably not performed after performing the first ion implantation dp1e for implanting fluorine into the memory channel region ch1b is as described in Embodiment 2. That is, in this step, by performing the first ion implantation dp1e immediately before or immediately after the ion implantation dp9 and avoiding the heat treatment, it is possible to further suppress the diffusion beyond a desired region. Thereby, the dangling bonds and the like in the memory channel region ch1b can be deactivated more efficiently, and the retention characteristic of the nonvolatile memory cell NVM2 can be improved further. As a result, the characteristics of the semiconductor device having the nonvolatile memory can be improved further.

Figure 32:
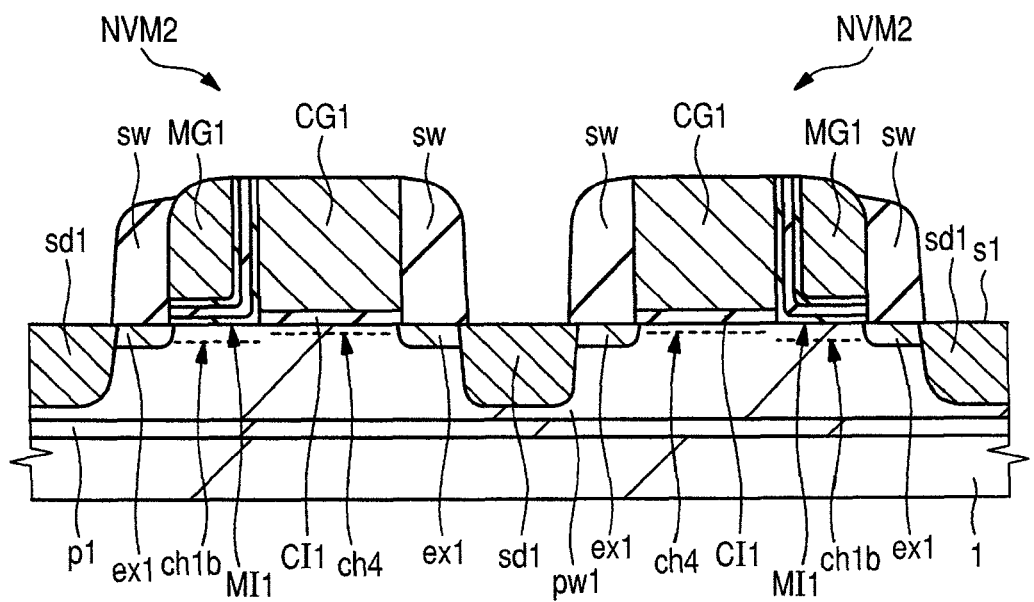
FIG. 32 is a cross sectional view of the principal part during the manufacturing process of the semiconductor device following the step of FIG. 31.

Next, as shown in FIG. 32, the side wall spacer sw is formed so as to cover the side walls of the memory gate electrode MG1 and control gate electrode CG1 of the principal plane s1 of the silicon substrate 1. The detailed configuration of the side wall spacer sw and the method thereof are the same as those of the steps that have been described using FIG. 18 in the manufacturing method of Embodiment 1.

Then, the memory source/drain region sd1 is formed as in the step described using FIG. 18.

Moreover, in the manufacturing method of Embodiment 3, the first ion implantation dp1e performed in the step of FIG. 25 may be performed immediately before or immediately after the ion implantation for forming the memory source/drain region sd1 of this step. Thus, in addition to the heat treatment required for the thermal oxidation for forming for example the charge storage film MI1 and the like, even the heat treatment for forming the memory extension region ex1 can be avoided and the first ion implantation dp1e can be performed. The reason why an excessive heat treatment is more preferably not performed after performing the first ion implantation dp1e for implanting fluorine into the memory channel region ch1b is as described in Embodiment 2. That is, in this step, by performing the first ion implantation dp1e immediately before or immediately after the ion implantation for forming the memory source/drain region sd1 and avoiding the heat treatment, it is possible to further suppress the diffusion beyond a desired region. Thereby, the dangling bonds and the like in the memory channel region ch1b can be deactivated more efficiently, and the retention characteristic of the nonvolatile memory cell NVM2 can be improved further. As a result, the characteristics of the semiconductor device having the nonvolatile memory can be improved further.

In this way, the nonvolatile memory cell NVN2 of Embodiment 3 can be formed over the silicon substrate 1.

In particular, in the step described using FIG. 25 and the like, fluorine is introduced into the memory channel region ch1b by implanting fluorine into the memory channel region ch1b by the first ion implantation dp1e and activating this fluorine by the first heat treatment. In this manner, the dangling bonds and defects in the memory channel region ch1b can be deactivated. Thereby, in the nonvolatile memory cell NVM1 of Embodiment 3, a charge stored in the charge storage film MI1 is unlikely to leak out, so that the retention characteristic can be improved. As a result, the characteristics of the semiconductor device having the nonvolatile memory can be improved further.

In the above, although the present invention made by the present inventor has been described specifically based on the embodiments, it is obvious that the present invention is not limited to the above embodiments and various modifications may be made without departing from the scope thereof.

For example, in Embodiment 1, as the method of operating the nonvolatile memory cell NVM1, the method of performing the write and erase operations by FN tunneling has been described, but not limited thereto. Other than this, the write or erase operation can be performed by channel hot carrier injection, BTBT, and the like. Likewise, in Embodiment 3, as the method of operating the nonvolatile memory cell NVM3, the method of performing the write operation by SSI and performing the erase operation by BTBT has been described, but not limited thereto. Other than this, the write or erase operation can be performed using FN tunneling, channel hot carrier injection, and the like.

The present invention can be applied to semiconductor devices required for performing information processing, for example, in personal computers, mobile computing devices, and the like.

What is claimed is:

1. A method of manufacturing a semiconductor device, comprising a step of forming a plurality of nonvolatile memory cells in a principal plane of a semiconductor substrate,
   wherein the step of forming the nonvolatile memory cells includes the steps of:
   (a) forming a first semiconductor region of a first conductivity type in the principal plane of the semiconductor substrate;
   (b) forming a memory gate electrode across a charge storage film at a position included in the first semiconductor region in a planar view, over the principal plane of the semiconductor substrate; and (c) implanting fluorine into a channel region of the principal plane of the semiconductor substrate by first ion implantation, and then activating the fluorine by a first heat treatment, wherein the channel region is a region located beneath the charge storage film that is formed in the step (b), of the principal plane of the semiconductor substrate, wherein the step (c) is performed at least after the step (a) is finished, and wherein the nonvolatile memory cell performs memory operations by transferring a charge to/from the charge storage film.

2. The method of manufacturing a semiconductor device according to claim 1, wherein in the first ion implantation of the step (c), fluorine is implanted into the channel region with a dosage of $1\times10^{13}$ to $1\times10^{15}$ cm$^{-2}$.

3. The method of manufacturing a semiconductor device according to claim 2, wherein the step (b) forms a first insulating film, a second insulating film, and a third insulating film sequentially as the charge storage film, wherein the second insulating film is an insulating film having a function to trap a charge, and the first and third insulating films sandwiching the second insulating film are insulating films having a function to prevent a charge trapped by the second insulating film from leaking to the outside, and wherein silicon oxide based insulating films are formed as the first and third insulating films.

4. The method of manufacturing a semiconductor device according to claim 3, wherein the first ion implantation of the step (c) is performed after the step (a) is finished and before the step (b).

5. The method of manufacturing a semiconductor device according to claim 4, wherein the step (b) forms the first insulating film by thermally oxidizing the semiconductor substrate, and wherein the first heat treatment of the step (c) is performed in the same step as that of the thermal oxidation for forming the first insulating film in the step (b).

6. The method of manufacturing a semiconductor device according to claim 3, wherein the step (b) includes the steps of:

(b1) forming a memory gate conductive film over the principal plane of the semiconductor substrate across the charge storage film; and (b2) forming the memory gate electrode by processing the memory gate conductive film, and wherein the first ion implantation of the step (c) is performed after the step (b1) and before the step (b2).

7. The method of manufacturing a semiconductor device according to claim 3, wherein the step of forming the nonvolatile memory cell further includes the step of (d) forming a second semiconductor region of a second conductivity type, which is an opposite conductivity type of the first conductivity type, in the principal plane of the semiconductor substrate in the first semiconductor region, of a lateral lower part of the memory gate electrode, wherein the step (d) forms the second semiconductor region by ion-implanting an impurity to be a second conductivity type into the principal plane of the corresponding semiconductor substrate, and performing a heat treatment, and wherein the first ion implantation of the step (c) is performed immediately before or immediately after the ion implantation for forming the second semiconductor region in the step (d).

8. The method of manufacturing a semiconductor device according to claim 7, wherein the first heat treatment of the step (c) is performed in the same step as that of the heat treatment for forming the second semiconductor region in the step (d).

9. The method of manufacturing a semiconductor device according to claim 3, wherein the step of forming the nonvolatile memory cell further includes the steps of:

(d) forming a second semiconductor region of the second conductivity type, which is an opposite conductivity type of the first conductivity type, in the principal plane of the semiconductor substrate in the first semiconductor region, of a lateral lower part of the memory gate electrode; and (e) forming a third semiconductor region of the second conductivity type in the principal plane of the semiconductor substrate in the first semiconductor region and also outside the second semiconductor region in a planar view, of a lateral lower part of the memory gate electrode, wherein the steps (d) and (e) form the second and third semiconductor regions respectively so that an impurity concentration of the second conductivity type of the third semiconductor region may be higher than that of the second conductivity type of the second semiconductor region, wherein the step (e) forms the third semiconductor region by implanting an impurity ion to be a second conductivity type into the principal plane of the corresponding semiconductor substrate, and performing a heat treatment, and wherein the first ion implantation of the step (c) is performed immediately before or immediately after the ion implantation for forming the second semiconductor region in the step (e).

10. The method of manufacturing a semiconductor device according to claim 9, wherein the first heat treatment of the step (c) is performed in the same step as that of the heat treatment for forming the third semiconductor region in the step (e).

11. The method of manufacturing a semiconductor device according to claim 3, wherein the step of forming the nonvolatile memory cell further includes the step of, after the step (a) and before the step (b), (d) forming a control gate electrode across a control gate insulating film at a position included in the first semiconductor region in a planar view, over the principal plane of the semiconductor substrate, wherein the step (d) forms a silicon oxide based insulating film as the control gate insulating film, and wherein the step (b) forms the memory gate electrode across the charge storage film so as to be adjacent to the control gate electrode formed in the step (d).

12. The method of manufacturing a semiconductor device according to claim 11, wherein the first ion implantation of the step (c) is performed after the step (a) is finished and before the step (d).

13. The method of manufacturing a semiconductor device according to claim 12, wherein the step (d) forms the control gate insulating film by thermally oxidizing the semiconductor substrate, and wherein the first heat treatment of the step (c) is performed in the same step as that of the thermal oxidation for forming the control gate insulating film in the step (d).

* * * * *